(12) United States Patent
Totsuka et al.

(10) Patent No.: US 10,742,910 B2
(45) Date of Patent: Aug. 11, 2020

(54) SUCCESSIVE APPROXIMATION ANALOG-TO-DIGITAL CONVERTER, IMAGING DEVICE, IMAGING SYSTEM, AND MOVING BODY

(71) Applicant: CANON KABUSHIKI KAISHA, Tokyo (JP)

(72) Inventors: Hirofumi Totsuka, Fujisawa (JP); Daisuke Yoshida, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 49 days.

(21) Appl. No.: 16/143,115

(22) Filed: Sep. 26, 2018

(65) Prior Publication Data

US 2019/0104265 A1    Apr. 4, 2019

(30) Foreign Application Priority Data

Sep. 29, 2017    (JP) .................. 2017-192054

(51) Int. Cl.
| | |
|---|---|
| *H04N 5/378* | (2011.01) |
| *H04N 5/361* | (2011.01) |
| *H04N 5/369* | (2011.01) |
| *H03M 1/00* | (2006.01) |
| *B60Q 9/00* | (2006.01) |
| *G05D 1/02* | (2020.01) |

(52) U.S. Cl.
CPC .............. *H04N 5/361* (2013.01); *H03M 1/00* (2013.01); *H04N 5/36963* (2018.08); *H04N 5/378* (2013.01); *H04N 5/379* (2018.08); *B60Q 9/008* (2013.01); *G05D 1/0231* (2013.01)

(58) Field of Classification Search
CPC ........ H04N 5/376; H04N 5/378; H04N 5/379; H04N 5/37457; H04N 5/37455; H04N 5/37452; H03M 1/00; H03M 1/12; H03M 1/14; H03M 1/442; H03M 1/1038
See application file for complete search history.

(56) References Cited

U.S. PATENT DOCUMENTS

| | | | |
|---|---|---|---|
| 6,885,396 B1 * | 4/2005 | Panicacci | H04N 5/3575 250/208.1 |
| 8,022,856 B2 * | 9/2011 | Sakakibara | H03M 1/20 341/150 |
| 10,291,251 B1 * | 5/2019 | Innocent | H03M 1/14 |
| 2009/0244334 A1 * | 10/2009 | Otaka | H04N 5/3575 348/294 |
| 2012/0025062 A1 * | 2/2012 | Neubauer | H03M 1/145 250/208.1 |

(Continued)

FOREIGN PATENT DOCUMENTS

| | | |
|---|---|---|
| JP | 2000-269814 A | 9/2000 |
| JP | 2008-271279 A | 11/2008 |

(Continued)

*Primary Examiner* — Kelly L Jerabek
(74) *Attorney, Agent, or Firm* — Canon U.S.A., Inc., IP Division

(57) ABSTRACT

A successive approximation analog-to-digital converter causes a comparator to compare an analog signal and a comparison signal that a first digital-to-analog converter converts into a voltage with an offset applied to the comparison signal by an offsetting unit. The successive approximation analog-to-digital converter can successfully carry out the second AD conversion and successive AD conversions of a signal.

17 Claims, 23 Drawing Sheets

(56) References Cited

U.S. PATENT DOCUMENTS

| | | |
|---|---|---|
| 2012/0112938 A1 | 5/2012 | Haneda |
| 2014/0008515 A1* | 1/2014 | Wang .................... H03M 1/145 |
| | | 250/208.1 |
| 2017/0078607 A1* | 3/2017 | Totsuka ............. H04N 5/37455 |

FOREIGN PATENT DOCUMENTS

| | | |
|---|---|---|
| JP | 2010-263399 A | 11/2010 |
| JP | 2011-55535 A | 3/2011 |
| JP | 2012-104938 A | 5/2012 |
| JP | 2012-151561 A | 8/2012 |
| JP | 2013-211611 A | 10/2013 |
| JP | 2015-023391 A | 2/2015 |

* cited by examiner

FRONT VIEW

TOP VIEW

REAR VIEW

SUCCESSIVE APPROXIMATION ANALOG-TO-DIGITAL CONVERTER, IMAGING DEVICE, IMAGING SYSTEM, AND MOVING BODY

BACKGROUND

Field

The present disclosure relates to an imaging device, an imaging system, and moving body.

Description of the Related Art

It has been known that an imaging device includes an analog-to-digital converter that converts signals that are outputted from pixels into digital signals. An example of the analog-to-digital converter of the imaging device is disclosed as a successive approximation analog-to-digital converter in Japanese Patent Laid-Open No. 2011-55535. The successive approximation analog-to-digital converter in Japanese Patent Laid-Open No. 2011-55535 carries out AD conversion of an analog signal multiple times to obtain digital signals. The average of the digital signals is calculated to reduce a noise component in the analog signal. According to Japanese Patent Laid-Open No. 2011-55535, the first AD conversion obtains an N-bit digital signal. In the second AD conversion and the successive AD conversions, the value of upper n bits of N bits is fixed to the same value as that of the digital signal that is obtained by the first AD conversion, and AD conversion of an (N–n)-bit analog signal is carried out. This decreases the time of the second AD conversion and the successive AD conversions. According to Japanese Patent Laid-Open No. 2011-55535, when the second AD conversion and the successive AD conversions are carried out, the processing stage of an AD convertor that generates a reference signal is put back several bits from the processing stage when the first AD conversion obtains the N-bit digital signal.

SUMMARY

The present disclosure provides a successive approximation analog-to-digital converter that converts an analog signal into an N-bit (N is an integer of 2 or more) digital signal. The successive approximation analog-to-digital converter includes a comparator that receives as inputs, the analog signal and a comparison signal, a first digital-to-analog converter that converts the comparison signal into a voltage corresponding to each bit of the N bits, a second digital-to-analog converter that includes an offsetting unit that applies an offset corresponding to lower n bits of the N bit to the comparison signal, and a controller that causes the comparator to perform a plurality of comparisons between the analog signal and the comparison signal that the first digital-to-analog converter converts into the voltage and the offset. An amount of the offset applied to the comparison signal by the offsetting unit is a same amount in each of the plurality of comparisons.

Further features will become apparent from the following description of exemplary embodiments with reference to the attached drawings.

DESCRIPTION OF THE EMBODIMENTS

Figure 1:
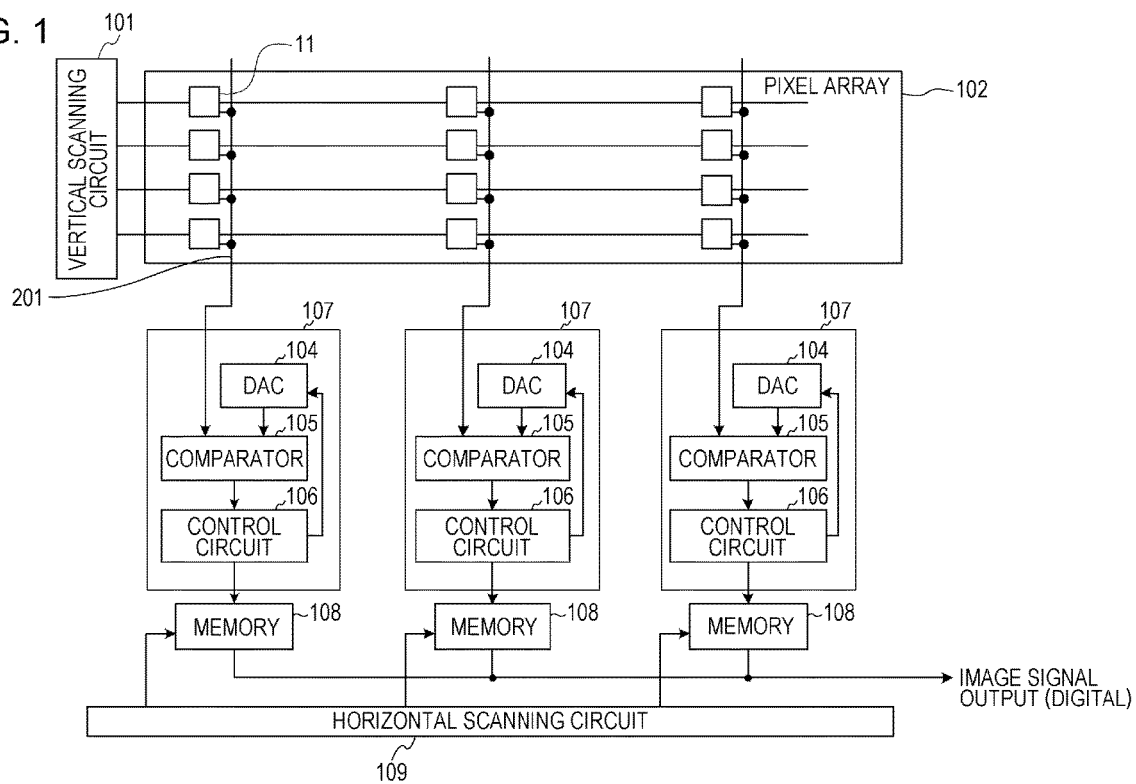
FIG. 1 illustrates the structure of an imaging device.

The technique described below relates to a successive approximation analog-to-digital converter that can successfully carry out the second AD conversion and successive AD conversions of a signal.

Embodiments will hereinafter be described with reference to the drawings. Like components throughout the embodiments are designated by like reference numbers, and a duplicated description is omitted. The embodiments can be partially modified or combined.

First Embodiment

The structure of an imaging device according to a first embodiment will be described with reference to a circuit block diagram in FIG. 1. The imaging device includes components illustrated in FIG. 1. A pixel array 102 includes pixels 11 that are arranged in a matrix. In an example illustrated in FIG. 1, the pixel array 102 includes the pixels 11 that are arranged in four rows and three columns. However, the arrangement of the pixel array 102 is not limited thereto. Each pixel 11 generates a pixel signal in accordance with light incident on the pixel 11. The pixels 11 in the same row are connected to a corresponding one of drive lines. The pixels 11 are supplied with respective control signals from a vertical scanning circuit 101 via the drive lines to control operation of the pixels 11. Each drive line includes control lines described later. The pixels 11 in the same column are connected to a corresponding one of signal lines 201. Voltage signals that are sent via the signal lines 201 are referred to as signals Vv1. In the case where the pixel signals are sent from the pixels 11 via the signal lines 201, the signals Vv1 have values corresponding to the respective pixel signals.

The imaging device includes analog-to-digital converters 107. The analog-to-digital converters 107 are successive approximation analog-to-digital converters. The analog-to-digital converters (referred to below as the ADCs) 107 include respective digital-to-analog converters 104 (referred to below as DACs 104. DAC is an abbreviation for a digital-to-analog converter). The ADCs 107 also include respective comparators 105 and control circuits 106.

Comparison signals are inputted into the comparators 105 from the DACs 104 in addition to the signals Vv1. The comparators 105 compare the signals Vv1 and the comparison signals and output the results of comparison to the control circuits 106.

The control circuits 106 output the results of comparison that are inputted from the comparators 105 to respective memories 108. The results of comparison that are outputted to the memories 108 are digital signals corresponding to the signals Vv1.

A horizontal scanning circuit 109 reads the digital signals that are outputted to the memories 108 from the memories 108 sequentially every column by horizontal scanning.

The DACs 104, the comparators 105, the control circuits 106, and the memories 108 are arranged for the respective signal lines 201.

Figure 2:
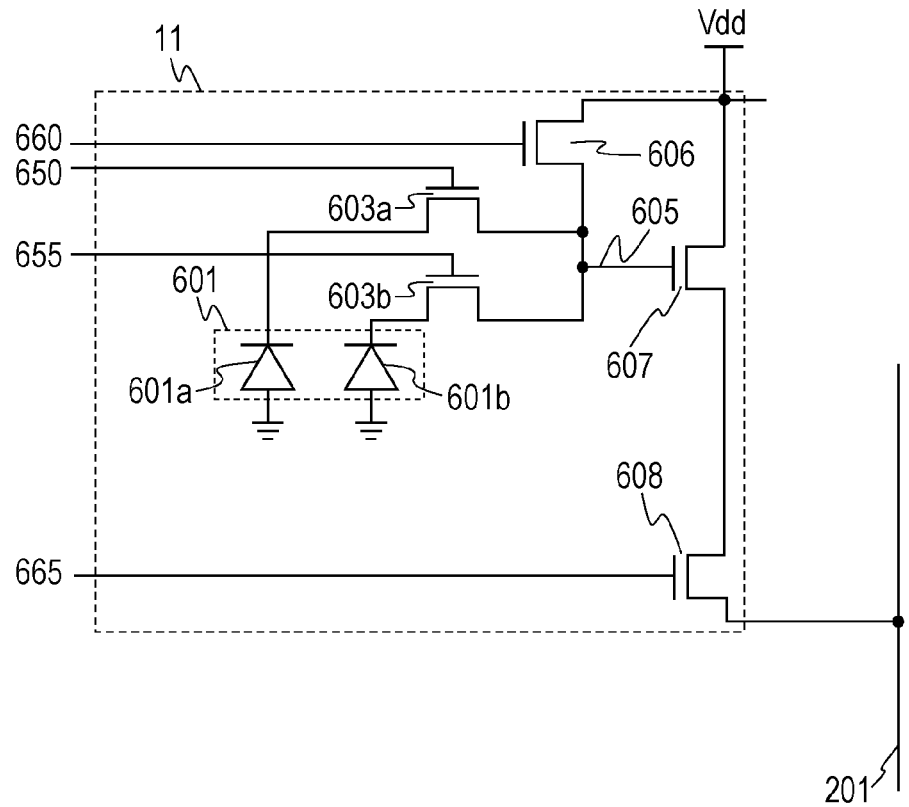
FIG. 2 illustrates an equivalent circuit of a pixel.

FIG. 2 illustrates an equivalent circuit of one of the pixels 11 according to the present embodiment. Each pixel 11 includes photodiodes 601a and 601b that are photoelectric converters. Light passes through a color filter and a microlens, not illustrated, and is incident on the photodiodes 601a and 601b of the pixel 11. Light incident on the photodiode 601a has substantially the same wavelength as light incident on the photodiode 601b.

The photodiode 601a is connected to a floating diffusion portion (referred to below as a FD portion) 605 with a transfer transistor 603a interposed therebetween. The gate of the transfer transistor 603a is connected to the vertical scanning circuit, not illustrated in FIG. 2, with a control line 650 interposed therebetween.

The photodiode 601b is connected to the floating diffusion portion (referred to below as the FD portion) 605 with a transfer transistor 603b interposed therebetween. The gate of the transfer transistor 603b is connected to the vertical scanning circuit, not illustrated in FIG. 2, with a control line 655 interposed therebetween.

The FD portion 605 is connected to a reset transistor 606 and the gate of an amplifying transistor 607.

The reset transistor 606 and the amplifying transistor 607 are supplied with a power supply voltage Vdd. The gate of the reset transistor 606 is connected to the vertical scanning circuit, not illustrated in FIG. 2, with a control line 660 interposed therebetween.

The amplifying transistor 607 is connected to a selection transistor 608. The gate of the selection transistor 608 is connected to the vertical scanning circuit, not illustrated in FIG. 2, with a control line 665 interposed therebetween.

The selection transistor 608 is connected to the corresponding signal line 201.

Figure 3:
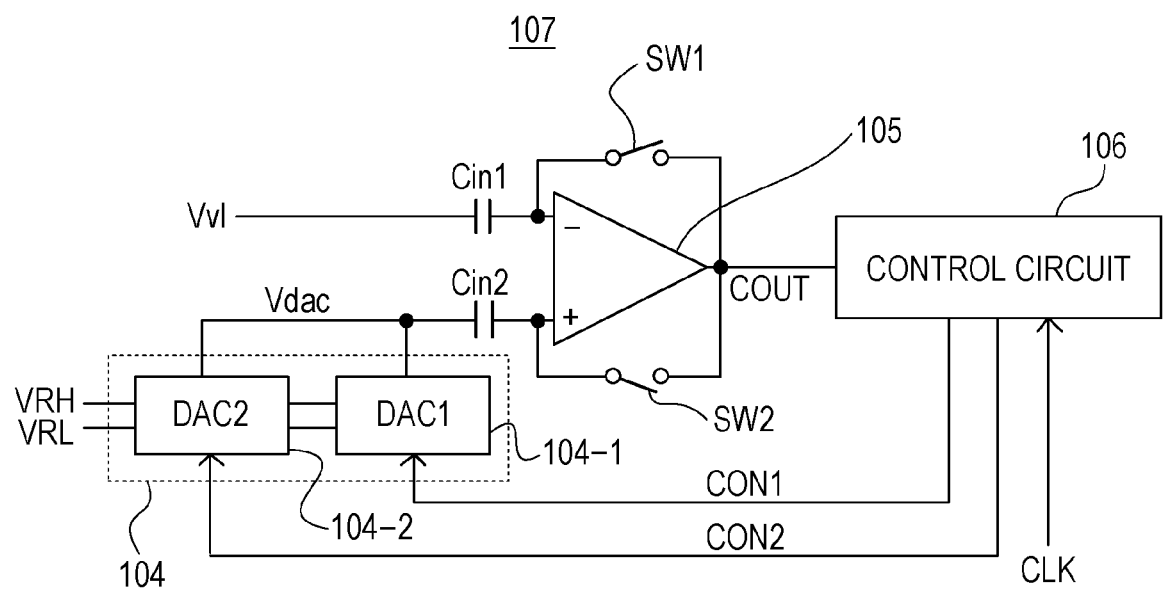
FIG. 3 illustrates an equivalent circuit of an analog-to-digital converter.

FIG. 3 illustrates an equivalent circuit of one of the ADCs 107 illustrated in FIG. 1. The ADC 107 includes the comparator 105, the DAC 104, and the control circuit 106.

One of nodes of each of capacitor elements Cin1 and Cin2 that provide input capacitances is connected to the comparator 105. The signal Vv1 is inputted into the other node of the capacitor element Cin1. A signal Vdac is inputted into the other node of the capacitor element Cin2. A switch SW1 is disposed on an electrical path between the input node of the comparator 105 connected to the capacitor element Cin1 and the output node of the comparator 105. A switch SW2 is disposed on an electrical path between the input node of the comparator 105 connected to the capacitor element Cin2 and the output node of the comparator 105. The switch SW1 and the switch SW2 are controlled by a timing generator, not illustrated.

Each DAC 104 includes a first DAC 104-1 and a second DAC 104-2. A signal COUT is inputted into each control circuit 106 from the corresponding comparator 105. A clock signal CLK is inputted into the control circuit 106 from the timing generator, not illustrated. The control circuit 106 outputs a signal CON1 to the first DAC 104-1. The control circuit 106 also outputs a signal CON2 to the second DAC 104-2.

Equivalent Circuit of DAC 104

Figure 4:
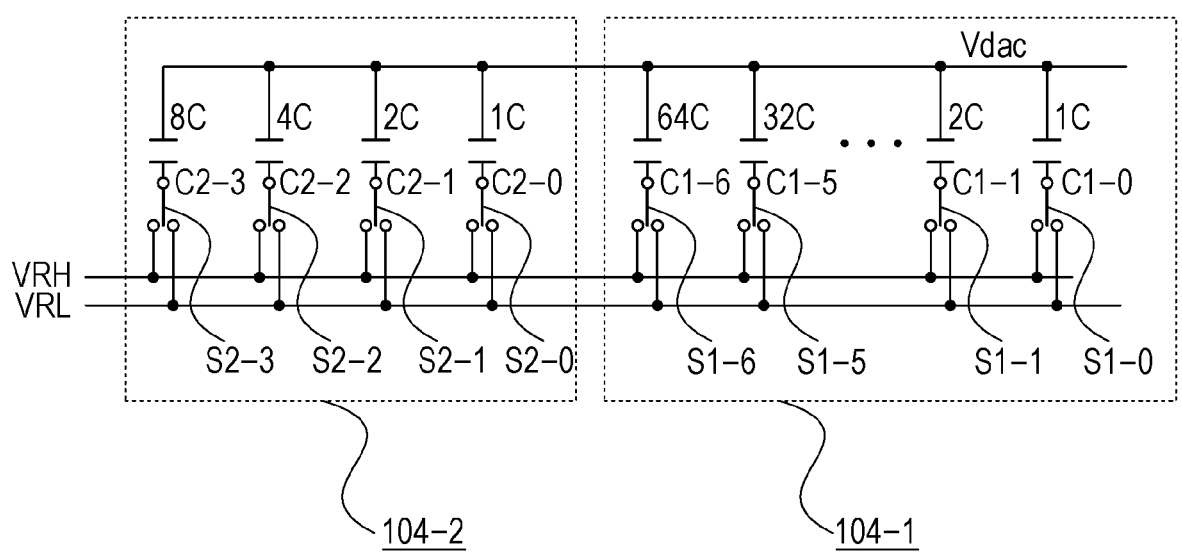
FIG. 4 illustrates an equivalent circuit of a digital-to-analog converter.

FIG. 4 illustrates the detail of an equivalent circuit of one of the DACs 104. FIG. 4 illustrates an equivalent circuit of the first DAC 104-1. FIG. 4 also illustrates an equivalent circuit of the second DAC 104-2.

The first DAC 104-1 includes capacitor elements C1-0 to C1-6. Switches S1-0 to S1-6 are disposed so as to correspond to the capacitor elements C1-0 to C1-6. In FIG. 4, illustration of the capacitor elements C1-2 to C1-4 and the switch S1-2 to S1-4 is omitted. The relationship of connection between the capacitor elements C1-2 to C1-4 and the switches S1-2 to S1-4 that are omitted is the same as the relationship between the capacitor element C1-0 and the switch S1-0. The capacitance values of the capacitor elements C1-0 to C1-6 satisfy binary weight relationship. The capacitance value of the capacitor element C1-0 is 1C. The capacitance values of the capacitor elements C1-1 to C1-6 are 2C, 4C, 8C, 16C, 32C, and 64C in this order. The switches S1-0 to S1-6 connect a voltage VRH or VRL to the corresponding capacitor elements C1-0 to C1-6. The signal CON1 that is outputted from each control circuit 106 controls switching the connection of the voltage VRH or VRL.

The second DAC 104-2 includes capacitor elements C2-0 to C2-3 and switches S2-0 to S2-3. The relationship of connection between the capacitor elements and the switches is the same as with the first DAC 104-1. The capacitance values of the capacitor elements C2-0 to C2-3 satisfy binary weight relationship. The capacitance value of the capacitor element C2-0 is 1C. The capacitance values of the capacitor elements C2-1 to C2-3 are 2C, 4C, and 8C in this order.

The first DAC 104-1 carries out AD conversion of a 7-bit signal. The second DAC 104-2 carries out AD conversion of a 4-bit signal. According to the present embodiment, ±6σ of a random noise is within 7 LSB. For this reason, the second DAC 104-2 carries out AD conversion of a 4-bit signal.

Figure 5:
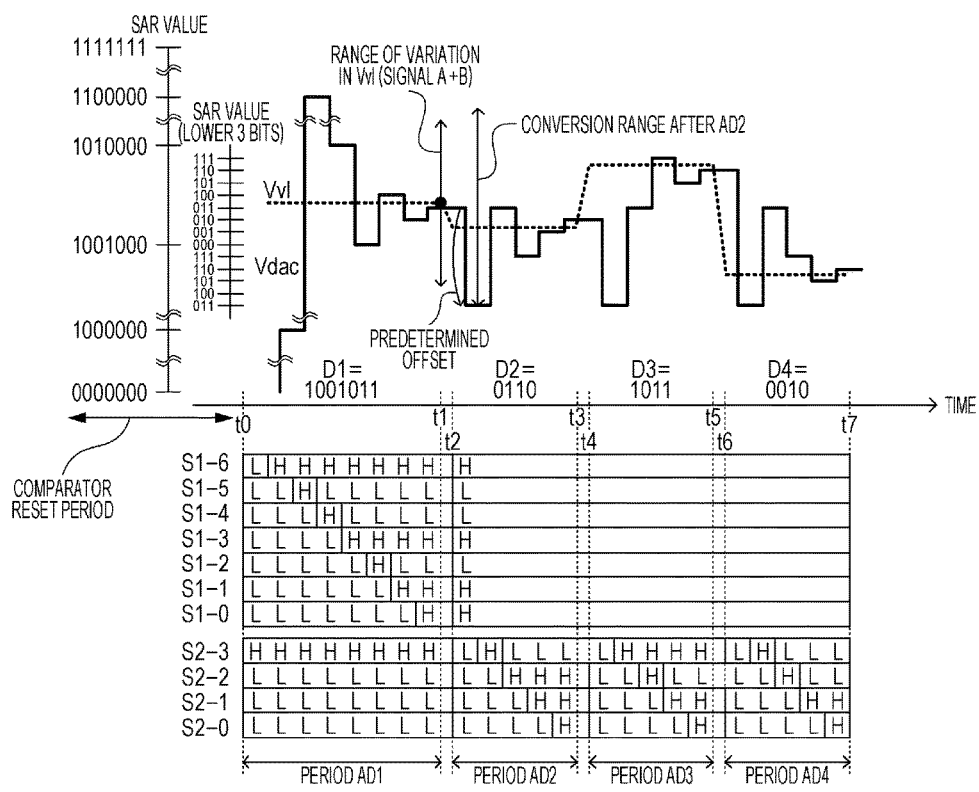
FIG. 5 is a timing chart illustrating operation of the imaging device.

FIG. 5 illustrates AD conversion with the imaging device according to the present embodiment.

According to the present embodiment, AD conversion is carried out multiple times for each pixel signal. Each pixel signal will now be described. A signal that is regarded as a pixel signal is outputted from the amplifying transistor 607 in a state where the reset transistor 606 does not discharge an electric charge from the FD portion 605 or the transfer transistors 603a and 603b do not transfer an electric charge to the FD portion 605. For example, in some cases, the voltage of the FD portion 605 varies due to a random noise while the amplifying transistor 607 outputs the signal when the selection transistor 608 of each pixel 11 is switched on. The random noise is typically caused due to the amplifying transistor 607. Consequently, the signal level of the amplifying transistor 607 varies. However, the reset transistor 606 does not discharge an electric charge from the FD portion 605 or the transfer transistors 603a and 603b do not transfer an electric charge to the FD portion 605. Accordingly, the variation in the voltage of the FD portion 605 due to such a noise results in a variation in a signal value substantially within a range in which the signal value is regarded as a pixel signal.

According to the present embodiment, AD conversion is carried out four times for each pixel signal. The first AD conversion generates a 7-bit digital signal as a N-bit (N is an integer of 2 or more) digital signal corresponding to the pixel signal. The second AD conversion and the successive AD conversions generate digital signals corresponding to lower n bits of N bits, specifically, lower 4 bits.

FIG. 5 illustrates the voltages of the signal Vv1 and the signal Vdac illustrated in FIG. 3 as an example of Vv1 and Vdac. The horizontal axis in FIG. 5 is time. The vertical axis represents a SAR (specific absorption rate) value representing the value of the digital signal corresponding to the signal Vdac. FIG. 5 also illustrates operation of the switches S1-0 to S1-6 and S2-0 to S2-3. The switches that are illustrated as L in FIG. 5 are connected to the voltage VRL. The switches that are illustrated as H in FIG. 5 are connected to the voltage VRH.

The voltage of the signal Vv1 illustrated in FIG. 5 will now be described.

The vertical scanning circuit sets the voltage of each control line 650 that is connected to the gate of the corresponding transfer transistor 603a and the voltage of each control line 655 that is connected to the gate of the corresponding transfer transistor 603b to high-level voltages. Consequently, electric charges (electrons according to the present embodiment) that are stored in the photodiodes 601a and 601b are transferred to the FD portion 605 via the transfer transistors 603a and 603b. At the FD portion 605, the electric charges of the photodiodes 601a and 601b are added. Consequently, the voltage of the FD portion 605 corresponds to an electric charge obtained by adding the electric charges of the photodiodes 601a and 601b. Assuming that the signal that the amplifying transistor 607 outputs on the basis of the voltage of the FD portion 605 derived from only the electric charge of the photodiode 601a is referred to as a signal A. Assuming that the signal that the amplifying transistor 607 outputs on the basis of the voltage of the FD portion 605 derived from only the electric charge of the photodiode 601b is referred to as a signal B. In accordance with the reference, the signal that the amplifying transistor 607 outputs on the basis of the voltage of the FD portion 605 corresponding to the electric charge obtained by adding the electric charges of the photodiodes 601a and 601b can be regarded as a signal A+B that is the sum of the signal A and the signal B. Accordingly, the signal A+B is outputted to the corresponding signal line 201.

The signal Vv1 illustrated in FIG. 5 is the voltage corresponding to the signal A+B.

The ADCs 107 carry out AD conversion of the signal A+B.

At time t0, each control circuit 106 outputs the signal CON1 to cause the switches of the corresponding first DAC 104-1 to be connected to the voltage VRL.

At time t0, the control circuit 106 outputs the signal CON2 to cause the switch S2-3 of the corresponding second DAC 104-2 to be connected to the voltage VRH. The output of the second DAC 104-2 at this time differs by an offset that is applied from that in the case where the switch S2-3 is connected to the voltage VRL. An offset corresponding to 8 LSB of a digital signal that is generated by AD conversion is applied although this will be described later. The timing generator, not illustrated, switches the switches SW1 and SW2 off from on with the signal Vdac outputted. Consequently, the reset of each comparator 105 is canceled. Consequently, the initial value of the signal Vdac becomes a voltage with the switches S1-0 to S1-6 and the switches S2-0 to S2-2 connected to the voltage VRL and the switch S2-3 connected to the voltage VRH. The switch S2-3 and the capacitor element C2-3 of the second DAC 104-2 function as an offsetting unit that applies the offset to the comparison signal.

Subsequently, the control circuit 106 causes the switch S1-6 to be connected to the voltage VRH. Consequently, the signal Vdac becomes a voltage corresponding to a SAR value of 100000. The signal Vv1 is larger than the amplitude of the signal Vdac, and the comparator 105 outputs a high-level comparison result signal. The control circuit 106 receives the high-level comparison result signal and sets the value of the seventh bit of the digital signal, which is the MSB (most significant bit), to 1.

The control circuit 106 that receives the high-level comparison result signal causes the switch S1-5 to be connected to the voltage VRH with the switch S1-6 connected to the voltage VRH. Consequently, the signal Vdac becomes a voltage corresponding to a SAR value of 1100000. The signal Vv1 is smaller than the amplitude of the signal Vdac, and the comparator 105 outputs a low-level comparison result signal. The control circuit 106 receives the low-level comparison result signal and sets the value of the sixth bit of the digital signal to 0.

The control circuit 106 that receives the low-level comparison result signal causes the switch S1-5 to be connected to the voltage VRL and causes the switch S1-4 to be connected to the voltage VRH with the switch S1-6 connected to the voltage VRH. Consequently, the signal Vdac becomes a voltage corresponding to a SAR value of 1010000. The signal Vv1 is smaller than the amplitude of the signal Vdac, and the comparator 105 outputs a low-level comparison result signal. The control circuit 106 receives the low-level comparison result signal and sets the value of the fifth bit of the digital signal to 0.

The control circuit 106 that receives the low-level comparison result signal causes the switches S1-5 and S1-4 to be connected to the voltage VRL and causes the switch S1-3 to be connected to the voltage VRH with the switch S1-6 connected to the voltage VRH. Consequently, the signal Vdac becomes a voltage corresponding to a SAR value of 1001000. The signal Vv1 is larger than the amplitude of the signal Vdac, and the comparator 105 outputs a high-level comparison result signal. The control circuit 106 receives the high-level comparison result signal and sets the value of the fourth bit of the digital signal to 1.

The control circuit 106 that receives the high-level comparison result signal causes the switches S1-5 and S1-4 to be connected to the voltage VRL with the switches S1-6 and S1-3 connected to the voltage VRH. The control circuit 106 causes the switch S1-2 to be connected to the voltage VRH. Consequently, the signal Vdac becomes a voltage corresponding to a SAR value of 1001100. The signal Vv1 is smaller than the amplitude of the signal Vdac, and the comparator 105 outputs a low-level comparison result signal. The control circuit 106 receive the low-level comparison result signal and sets the value of the third bit of the digital signal to 0.

The control circuit 106 that receive the low-level comparison result signal causes the switches S1-5, S1-4, and S-1-2 to be connected to the voltage VRL with the switches S1-6 and S1-3 connected to the voltage VRH. The control circuit 106 causes the switch S1-1 to be connected to the voltage VRH. Consequently, the signal Vdac becomes a voltage corresponding to a SAR value of 1001010. The signal Vv1 is larger than the amplitude of the signal Vdac, and the comparator 105 outputs a high-level comparison result signal. The control circuit 106 receives the high-level comparison result signal and sets the value of the second bit of the digital signal to 1.

The control circuit 106 that receives the high-level comparison result signal causes the switches S1-5, S1-4, and S-1-2 to be connected to the voltage VRL with the switches S1-6, S1-3, and S1-1 connected to the voltage VRH. The control circuit 106 causes the switch S1-0 to be connected to the voltage VRH. Consequently, the signal Vdac becomes a voltage corresponding to a SAR value of 1001011. The signal Vv1 is larger than the amplitude of the signal Vdac, and the comparator 105 outputs a high-level comparison result signal. The control circuit 106 receives the high-level comparison result signal and sets the value of LSB (least significant bit) of the digital signal to 1. Consequently, a digital signal D1 corresponding to the signal A+B is determined to be 1001011. At this time, the switches S1-0, S1-1, S1-3, and S1-6 of the first DAC 104-1 are connected to the voltage VRH. The switches S1-2, S1-4, and S1-5 of the first DAC 104-1 are connected to the voltage VRL.

In this state, the control circuit 106 outputs the signal CON2 to change the voltage to which the switch S2-3 of the second DAC 104-2 is connected into the voltage VRL from the voltage VRH. Consequently, the voltage of the signal Vdac becomes a voltage corresponding to 1000011, which is a value obtained by setting the value of the fourth bit of the digital signal D1 from the least significant bit to 0. That is, the signal Vdac corresponding to a digital signal that is 8 LSB smaller than the digital signal D1 is outputted, and this signal Vdac differs from the signal Vdac when the digital signal D1 is determined by the first AD conversion. That is, at time t0, the initial value of the signal Vdac is the value when the switch S2-3 of the second DAC 104-2 is connected to the voltage VRH. Consequently, the signal Vdac can be determined to correspond to a voltage whose amplitude is lower than that of the voltage of the signal Vdac when the value of the digital signal D1 is determined by the first AD conversion. This makes the second AD conversion of a 4-bit signal likely to be carried out within the permissible range even when the amplitude of the signal Vv1 decreases by being affected due to a random noise.

If the switch S2-3 is connected to the voltage VRL at time t0, the second DAC 104-2 cannot decrease the amplitude of the signal Vdac. Accordingly, the second AD conversion of a 4-bit signal cannot be carried out within the permissible range even when the amplitude of the signal Vv1 decreases by being affected due to a random noise. It is assumed that the voltage of the signal Vdac is changed by switching the switch S1-3 of the first DAC 104-1 without providing the second DAC 104-2. In this case, however, it is necessary to change the process in accordance with the value of the fourth bit of the digital signal D1. For example, in the case where the value of the digital signal D1 is 1000000, the voltage to which the switch S1-6 is connected is changed from the voltage VRH into the voltage VRL to generate a signal Vdac corresponding to a digital signal that is decreased by 16 LSB. In addition, it is necessary for the voltage to which the switch S1-3 is connected to be changed from the voltage VRL to the voltage VRH. Thus, there is a need to change the process in accordance with the value of the digital signal D1. This makes the process complicated.

According to the present embodiment, however, the initial value of the signal Vdac is determined with the switch S2-3 of the second DAC 104-2 connected to the voltage VRH. This enables the offset to be applied to the signal Vdac corresponding to 8 LSB without dependence on the value of the digital signal D1.

The second AD conversion with the offset will be described.

Regarding the signal Vv1, the voltage is affected by a random noise and differs from the voltage when the first AD conversion is carried out.

The amplitude of the signal Vv1 is larger than the amplitude of the signal Vdac with the switch S2-3 connected to the voltage VRL. Accordingly, the comparator 105 outputs a high-level comparison result signal.

The control circuit 106 receives the high-level comparison result signal and causes the switch S2-3 to be connected to the voltage VRH. Consequently, the signal Vdac becomes a voltage corresponding to the signal value of the digital signal D1. When the comparison result signal of the comparator 105 is on a low level, the amplitude of the signal Vv1 is decided to be lower than the range that enables the second AD conversion to be carried out. In this case, the range of the second AD conversion can be changed such that a voltage whose amplitude is small is permissible, or the second AD conversion is canceled. In the case where the decision is not necessary, it is not necessary to change the voltage to which the switch S2-3 is connected from the voltage VRH to the voltage VRL at time t2.

During a period from time t2 to time t3, the other AD conversions can be the same as the first AD conversion. Consequently, a digital signal D2 having a value of 0110 can be obtained.

AD conversion during a period from time t4 to time t5 can be the same as the second AD conversion. Consequently, a digital signal D3 having a value of 1011 can be obtained.

AD conversion during a period from time t6 to time t7 can be the same as the second AD conversion. Consequently, a digital signal D4 having a value of 0010 can be obtained.

The following processes are performed with respect to the obtained digital signals.

The MSB of the digital signals D2, D3, and D4 obtained is inverted. Digital signals Dv2, Dv3, and Dv4 after inversion are as follows: the digital signal Dv2=1110, the digital signal Dv3=0011, and the digital signal Dv4=1010. The digital signals Dv2, Dv3, and Dv4 represent differences from the digital signal D1.

Subsequently, the value of a digital signal DF corresponding to an amplified signal Vamp is determined by performing the following calculation: digital signal DF=D1+(Dv2+Dv3+Dv4)/4. The digital signal DF corresponds to a signal obtained by decreasing a random noise from the digital signal D1. The calculation to obtain the digital signal DF may be performed by the memories 108 illustrated in FIG. 1 or a signal processing unit that is disposed on the outside of the imaging device.

In the imaging device according to the present embodiment, the switch S2-3 and the capacitor element C2-3 of the second DAC 104-2, which function as the offsetting unit, thus apply the offset to the comparison signal. The control circuit 106, which functions as the controller, causes the comparator to compare the signal Vv1, which is the analog signal, and the signal Vdac, which is the comparison signal that the first DAC 104-1 converts into the voltage with the offset applied to the comparison signal. In this way, a predetermined-bit-number offset can be applied to the signal Vdac to carry out the second AD conversion and the successive AD conversions regardless of the value of the digital signal D1.

Second Embodiment

According to the first embodiment, the second AD conversion and the successive AD conversions are carried out as AD conversions of a 4-bit signal, and lower n bits of N bits is 4 bits. The bit number of the second AD conversion and the successive AD conversions according to a second embodiment will be described.

Figure 6:
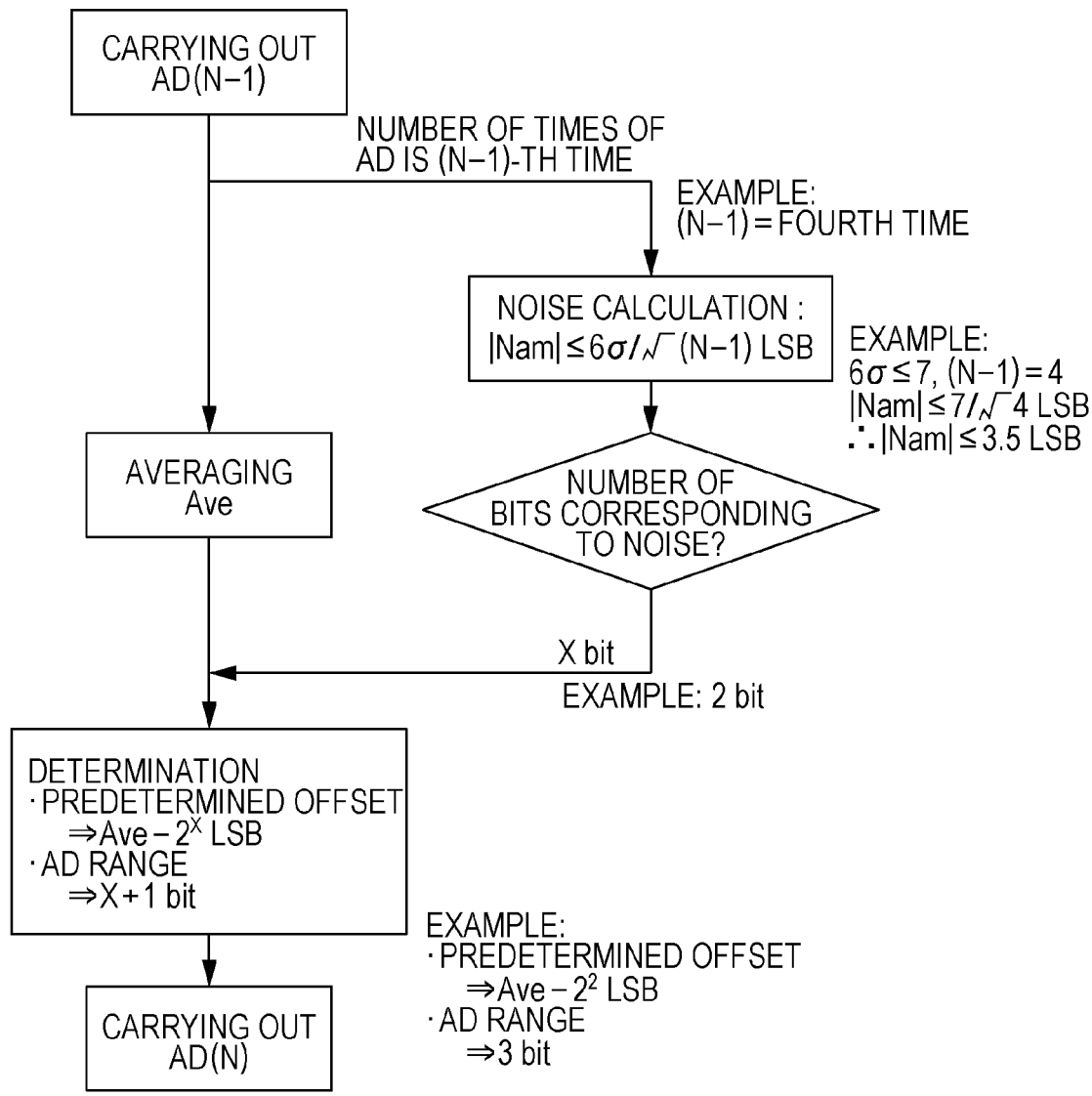
FIG. 6 is a chart illustrating processes of AD conversion.

FIG. 6 is a chart illustrating processes for determining the bit number of the second AD conversion and the successive AD conversions according to the present embodiment.

Assuming that a random noise has a normal distribution, the second AD conversion is AD conversion of 6σ LSB or more where σ is a standard deviation. According to the present embodiment, it is assumed that 6σ is 7 or less as in the first embodiment.

The ADCs 107 carry out the (N−1)-th AD conversion.

A calculation unit, not illustrated, estimates the absolute value |Nam| of a noise. The absolute value can be estimated as: |Nam|≤6σ×√(N−1). When N−1 is 4, the absolute value is estimated as: |Nam|≤3.5 (LSB).

Accordingly, the calculation unit decides that the noise corresponds to a signal whose bit number is about X bits. Since |Nam|≤3.5 (LSB) holds here, the calculation unit decides that the noise corresponds to a signal whose bit number is about 2 bits including 3.5 LSB. The calculation unit averages the digital signals that are obtained hitherto to generate a digital signal Ave.

The calculation unit subtracts a signal corresponding to 2^X LSB (the symbol "^" represents a power) from the digital signal Ave to obtain a signal corresponding to the offset. The calculation unit determines the bit number of the subsequent AD conversion AD (N) to be X+1 bits.

In the case of N=2, 6σ corresponds to 7 LSB, and X+1 is 4 bits. Accordingly, the second AD conversion is AD conversion of a 4-bit signal. In the cases of N=3; and N=4, X+1 is 4 bits. Similarly, the third AD conversion and the fourth AD conversion are AD conversion of a 4-bit signal. In the case of N=5, X+1 is 3 bits. Accordingly, the fifth AD conversion is AD conversion of a 3-bit signal. The bit number of the subsequent AD conversion can be thus decreased as the number of times the AD conversion is carried out increases.

The imaging device according to the present embodiment can decrease the period during which AD conversion is carried out multiple times by estimating the magnitude of the noise.

Third Embodiment

An imaging device according to a third embodiment, mainly, differences thereof from the first embodiment will be described.

Figure 7:
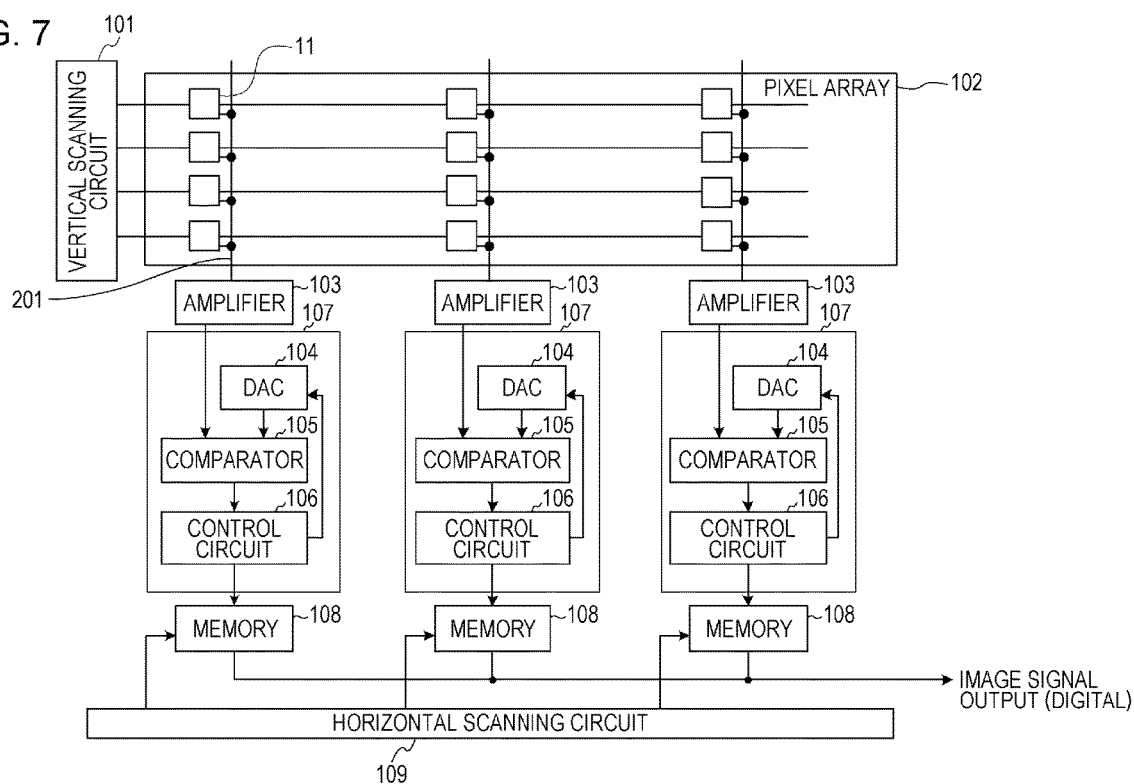
FIG. 7 illustrates the structure of the imaging device.

FIG. 7 illustrates the structure of the imaging device according to the present embodiment. The imaging device according to the present embodiment includes amplifiers 103 that amplify the signal Vv1 and output the amplified signal Vamp to the respective comparators 105.

Figure 8:
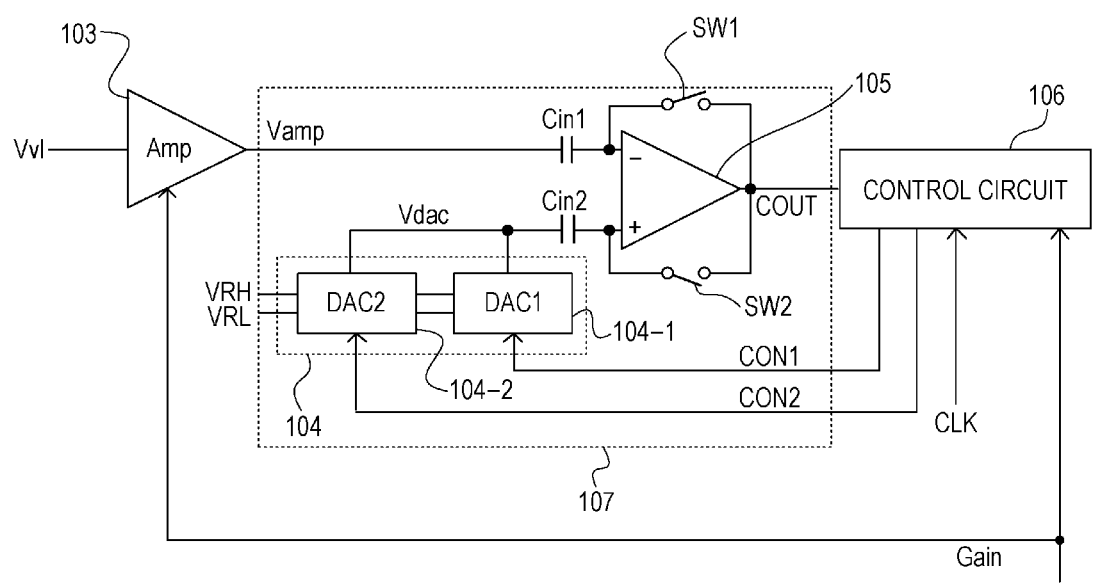
FIG. 8 illustrates an equivalent circuit of an amplifier and the analog-to-digital converter.

FIG. 8 illustrates one of the amplifiers 103 and the corresponding ADC 107 in FIG. 7. The gain value of each amplifier 103 is variable and is determined by using a signal Gain from the timing generator, not illustrated. The signal Gain is information to determine the amplification factor thereof and is inputted also into the control circuits 106 of the ADCs 107. The control circuits 106 determine the bit number of the second AD conversion and the successive AD conversions by using the signal Gain.

The amplifiers 103 use the gain value that is determined by using the signal Gain for the signal Vv1. The amplifiers 103 obtain the amplified signal Vamp by amplifying the signal Vv1 by using the gain value and output the amplified signal Vamp to the comparators 105.

As the gain value of the amplifiers 103 increases, the magnitude of a noise contained in the amplified signal Vamp increases. Accordingly, the imaging device according to the present embodiment increases the bit number of the second AD conversion and the successive AD conversions in accordance with an increase in the gain value of the amplifiers 103. Assuming that the values of 6σ of a random noise in the cases where the gain value is 1 times, 4 times, and 16 times are 7, 15, and 31 LSB in this order. In the case where the gain value is 1 times, the bit number of the second AD conversion and the successive AD conversions is typically determined to be 3 bits. In the case where the gain value is 4 times, the bit number of the second AD conversion and the successive AD conversions is typically determined to be 4 bits. In the case where the gain value is 16 times, the bit number of the second AD conversion and the successive AD conversions is typically determined to be 5 bits. The bit number of the second AD conversion and the successive AD conversions is thus increased in accordance with an increase in the gain value of the amplifiers 103. This enables the imaging device according to the present embodiment to generate a digital signal whose noise is reduced in accordance with the gain value of the amplifiers.

The imaging device according to the present embodiment can be combined with the second embodiment.

Fourth Embodiment

An imaging device according to a fourth embodiment, mainly, differences thereof from the first embodiment will be described.

In the imaging device according to the present embodiment, each pixel 11 illustrated in FIG. 2 outputs a signal (signal A) based on the electric charge of the corresponding photodiodes 601a. The pixel 11 also outputs a signal (signal A+B) based on an electric charge obtained by adding the electric charges of the corresponding photodiodes 601a and 601b. The signal A is a first signal based on the electric charges of some of the photoelectric converters. The signal A+B is a second signal based on the electric charges of all of the photoelectric converters.

In the imaging device according to the present embodiment, the bit number of the AD conversion of the signal A is smaller than the bit number of the AD conversion of the signal A+B. Specifically, the bit number of the AD conversion of the signal A is a lower 1 bit smaller than the bit number of the AD conversion of the signal A+B.

According to the present embodiment, the bit number of the AD conversion of a signal N is smaller than the bit number of the AD conversion of the signal A+B. Specifically, the bit number of the AD conversion of the signal N is upper 2 bits smaller than the bit number of the AD conversion of the signal A+B.

Figure 9:
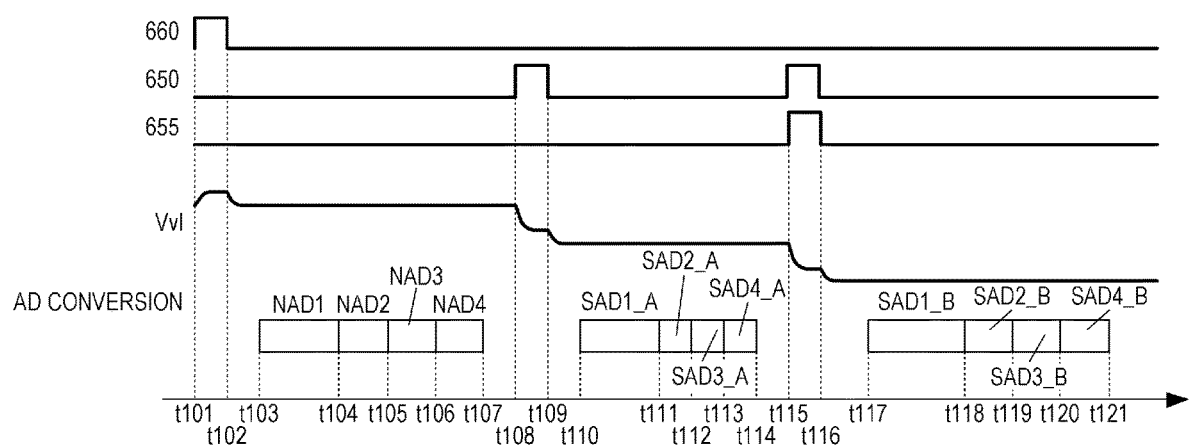
FIG. 9 illustrates operation of the imaging device.

FIG. 9 is a timing chart illustrating operation of the imaging device according to the present embodiment. The reference numbers 650, 655, and 660 in FIG. 9 correspond to the control lines in FIG. 2.

At time t102, the vertical scanning circuit 101 changes the voltage of each control line 660 from a high level to a low level. Consequently, the reset of each FD portion 605 is canceled, and a noise signal (signal N) is outputted to the corresponding signal line 201.

During a period from time t103 to time t107, the ADCs 107 carry out AD conversion of the signal N. During a period from time t104 to time t103, the first AD conversion of the signal N is carried out with A bits (NAD1).

The second AD conversion and the successive AD conversions of the signal N are carried out with B bits smaller than A bits. The AD conversion of a B-bit signal is carried out three times (NAD2 to NAD4).

A signal obtained by averaging the digital signals obtained by the NAD2 to NAD4 and the digital signal obtained by the NAD1 are used to obtain a digital signal DN corresponding to the signal N.

At time t108, the vertical scanning circuit 101 sets the voltage of the control line 650 to a high-level voltage. At time t109, the vertical scanning circuit 101 sets the voltage of the control line 650 to a low-level voltage. Consequently, the electric charge of the photodiode 601a is transferred to the FD portion 605. The amplifying transistor 607 then outputs the signal A corresponding to the electric charge of the photodiode 601a to the signal line 201.

During a period from time t110 to time t114, the ADCs 107 carry out the AD conversion of the signal A. During a period from time t110 to time t111, the first AD conversion of the signal A is carried out with C bits (SAD1_A). The bit number of C bits is larger than that of A bits.

The second AD conversion and the successive AD conversions of the signal A are carried out with D bits smaller than C bits. The AD conversion of a D-bit signal is carried out three times (SAD2_A to SAD4_A). The bit number of D bits is larger than that of B bits.

A signal obtaining by averaging the digital signals obtained by the SAD2_A to SAD4_A and the digital signal obtained by the SAD1_A are used to obtain a digital signal DA corresponding to the signal A.

The FD portion 605 has the electric charge that is transferred from the photodiode 601a before time t115.

At time t115, the vertical scanning circuit 101 sets the voltages of the control line 650 and the control line 655 to high-level voltages. At time t116, the vertical scanning circuit 101 changes the voltages of the control line 650 and the control line 655 into low-level voltages. Consequently, the electric charge that is stored in the photodiode 601a during a period from time t109 to time t116 and the electric charge that is stored in the photodiode 601b during a period before time t101 until time t116 are transferred to the FD portion 605. The electric charges of the photodiodes 601a and 601b are then added to that of the FD portion 605. The amplifying transistor 607 outputs the signal A+B corresponding to the electric charge obtained by adding the electric charges of the photodiodes 601a and 601b to the signal line 201.

During a period from time t117 to time t121, the ADCs 107 carry out the AD conversion of the signal A+B. During a period from time t117 to time t118, the first AD conversion of the signal A+B is carried out with E bits (SAD1_B). The bit number of E bits is larger than that of C bits.

The second AD conversion and the successive AD conversions of the signal A are carried out with F bits smaller than E bits. The AD conversion of a F-bit signal is carried out three times (SAD2_B to SAD4_B). The bit number of F bits is larger than that of B bits.

A signal obtained by averaging the digital signals obtained by the SAD2_B to SAD4_B and the digital signal obtained by the SAD1_B are used to obtain a digital signal DAB corresponding to the signal A+B.

The maximum amplitude of the signal N, the signal A, and the signal A+B satisfies the following relationship: the maximum amplitude of the signal N<the maximum amplitude of the signal A<the maximum amplitude of the signal A+B. In accordance with this relationship, the ADCs of the imaging device according to the present embodiment change the bit number of the first AD conversion, the second AD conversion, and the successive AD conversions of the signals.

The bit number of AD conversion according to the present embodiment is summarized as follows: the bit number of NAD1 is A bits, the bit number of NAD2 to NAD4 is B bits, the bit number of SAD1_A is C bits, the bit number of SAD2_A to SAD4_A is D bits, the bit number of SAD1_B is E bits, and the bit number of SAD2_B to SAD4_B is F bits.

The relationship of the bit number is as follows. The bit number satisfies A<C<E during the first AD conversion of the signal. The bit number satisfies B<D<F during the second AD conversion and the successive AD conversions of the signals. The bit number of F bits is typically smaller than that of A bits. Accordingly, B<D<F<A<C<E holds.

Figure 10:
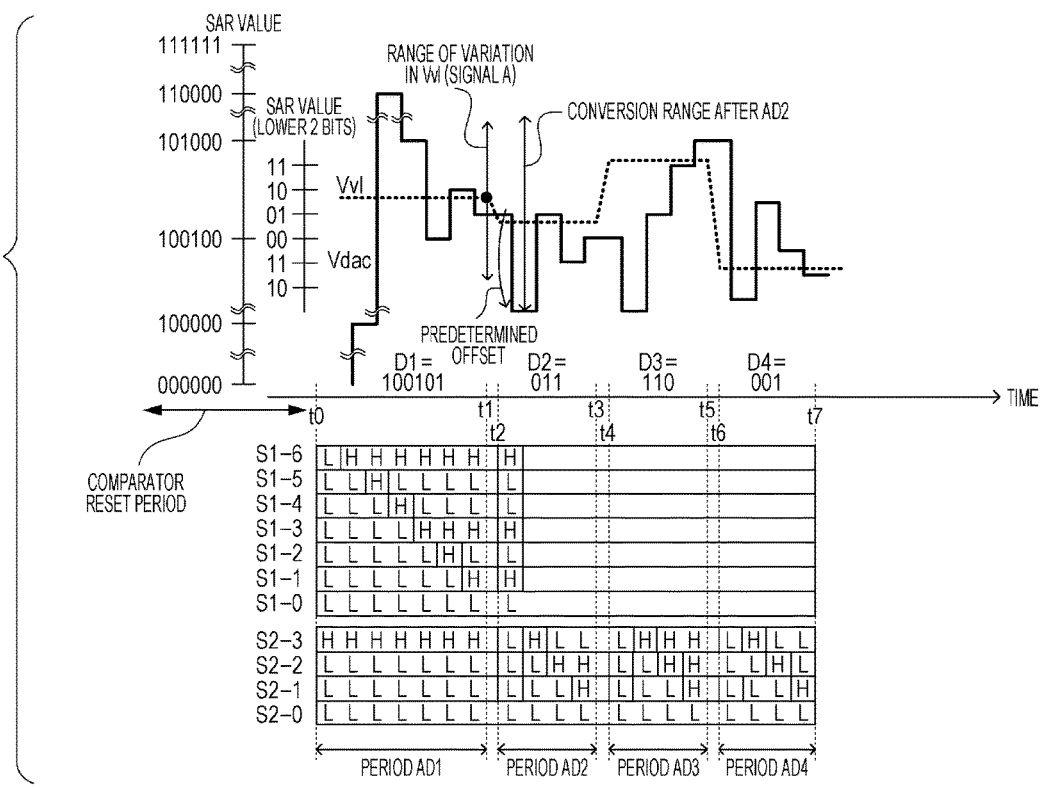
FIG. 10 illustrates AD conversion.

FIG. 10 illustrates operation of each ADC 107 to carry out the AD conversion of the signal A according to the present embodiment. The AD conversion of the signal A differs from that in the first embodiment in that the bit number is smaller than that in the AD conversion of the signal A+B and the voltage to which the switches S1-0 and S2-0 are connected is fixed to the voltage VRL. The other matters of the AD conversion are the same as in the first embodiment.

This enables the imaging device according to the present embodiment to generate a digital signal whose noise is reduced and enables to decrease a period during which the AD conversion of a signal is carried out multiple times.

According to the present embodiment, the bit number of the AD conversion of the signal A is smaller than the bit number of the AD conversion of the signal A+B. To increase the resolution of the signal A, the bit number of the signal A may be larger than the bit number of the signal A+B. The pixel 11 in FIG. 2 includes the photodiodes 601a and 601b for the single microlens as described above. Accordingly, the use of the signal A and the signal B obtained by subtracting the signal A from the signal A+B enables focus to be detected in a phase difference detection manner. To increase the precision of the focus detection, the resolution of the signal A can be higher than that of the signal A+B. In this case, the bit number of the signal A may be larger than the bit number of the signal A+B. The bit number in this case satisfies A<E<C.

In another example, the signal B is obtained by subtracting the signal A from the signal A+B for the focus detection. At this time, the resolution of the signal A preferably matches the resolution of the signal B. From this perspective, the bit number of the AD conversion of the signal A may be the same as the bit number of the AD conversion of the signal A+B. The bit number in this case satisfies A<C=E. The relationship of the bit number according to the present embodiment includes A<C≤E or A<E≤C.

Fifth Embodiment

Each imaging device according to the first to fourth embodiments is not limited to an imaging device that is formed on a semiconductor substrate and may be a lamination-type imaging device.

A fifth embodiment described below relates to a lamination-type imaging device.

Overall Structure of Imaging Device

Figure 11:
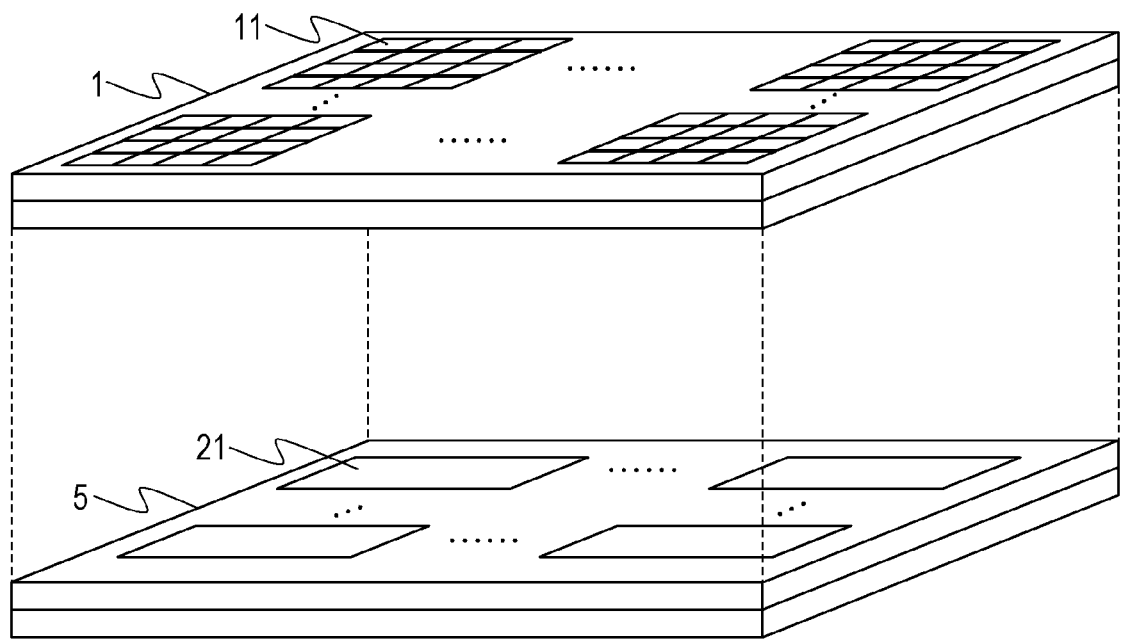
FIG. 11 illustrates the structure of a lamination-type imaging device.

FIG. 11 illustrates a first chip 1 and a second chip 5 of an imaging device according to the present embodiment. The first chip 1 is a pixel chip that includes a pixel array in which the pixels 11 are arranged in rows and columns. The second chip 5 is a circuit chip on which signal processing circuits 21 are arranged in rows and columns. Although only the pixels 11 and the signal processing circuits 21 are illustrated in FIG. 11, the first chip 1 includes control lines for controlling the pixels 11 and signal lines through which signals that are outputted from the pixels 11 are transmitted. The first chip 1 or the second chip 5 includes appropriate drive circuits such as the vertical scanning circuit and the timing generator.

Arrangement of Pixels in Pixel Array

Figure 12:
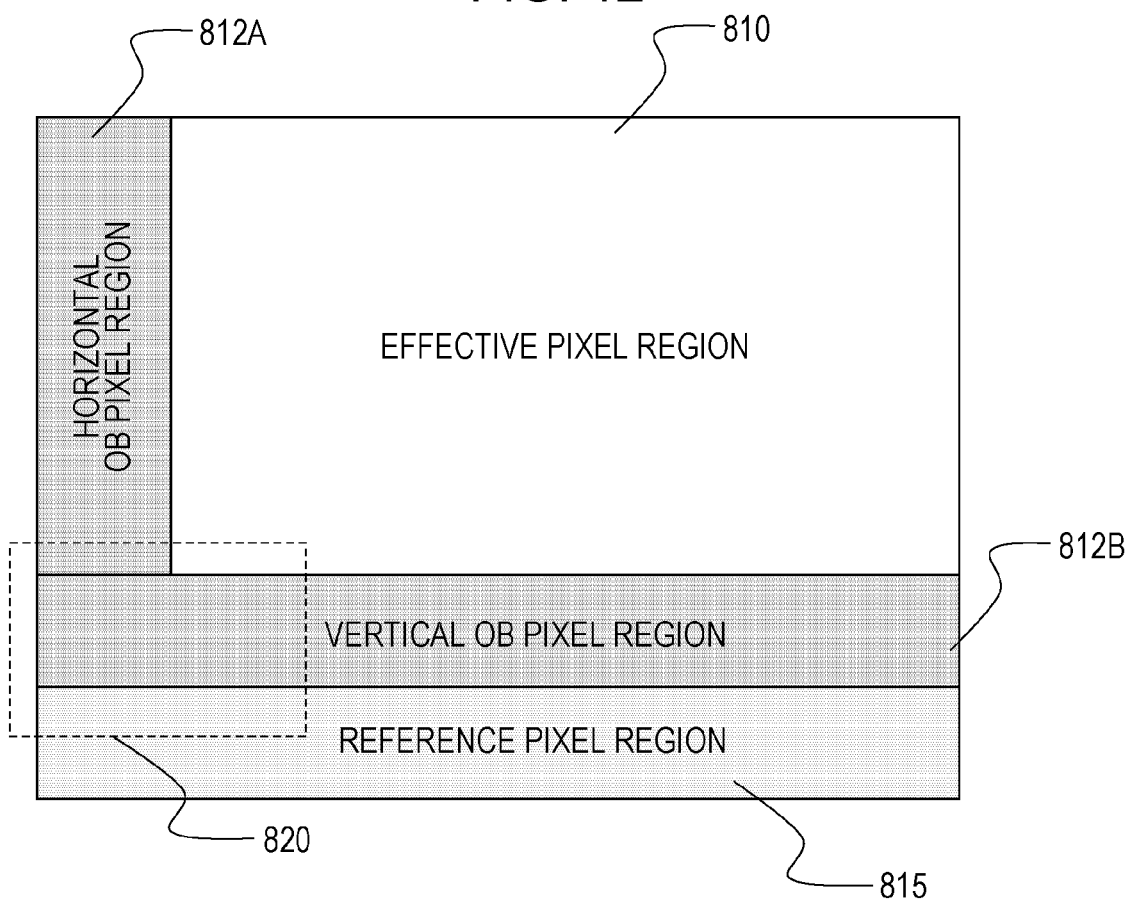
FIG. 12 illustrates the arrangement of pixels that a pixel array includes.

FIG. 12 illustrates the pixel array of the first chip 1. The pixels 11 of the pixel array according to the present embodiment include effective pixels, optical black pixels (OB pixels), and reference pixels. The structure of each pixel will be described later. The pixel array has an effective pixel region 810, a horizontal OB pixel region 812A, a vertical OB pixel region 812B, and a reference pixel region 815.

The vertical OB pixel region 812B is located between the reference pixel region 815 and the effective pixel region 810. The horizontal OB pixel region 812A is located outside an edge of the effective pixel region 810. A combination of the horizontal OB pixel region 812A and the vertical OB pixel region 812B forms an L-shaped OB pixel region that is adjacent to the effective pixel region 810.

Figure 13:
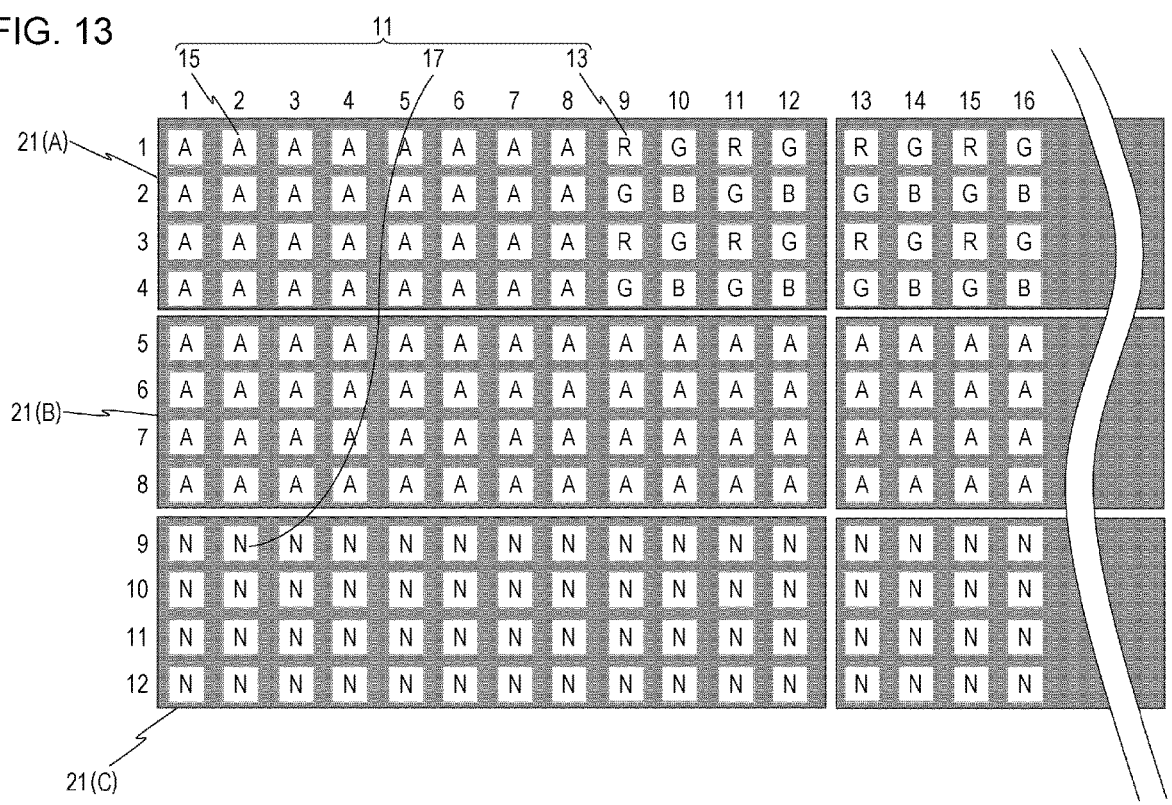
FIG. 13 illustrates the arrangement of the lamination-type imaging device in a plan view.

Relationship of Arrangement of Pixels and Signal Processing Circuits in Plan View FIG. 13 illustrates the layout of the pixels 11 of the first chip 1 and the signal processing circuits 21 (A) to 21 (C) of the second chip 5 in a plan view in a region 820 in FIG. 12. In the following description, the signal processing circuits are simply represented by 21 when the signal processing circuits 21 (A) to 21 (C) are not distinguished.

The pixels 11 include effective pixels 13. FIG. 13 also illustrates the color of a color filter that each effective pixel 13 includes. R illustrated in FIG. 13 represents that the corresponding effective pixel 13 includes a color filter for red (R). Similarly, G represents that the corresponding effective pixel 13 includes a color filter for green (G), and B represents that the corresponding effective pixel 13 includes a color filter for blue (B).

In other words, light whose wavelength corresponds to a first color is incident on some of the pixels, and light whose wavelength corresponds to a second color is incident on other pixels.

The wavelength corresponding to the red color typically ranges from 600 to 830 nm. The wavelength corresponding to the green color typically ranges from 500 to 600 nm. The wavelength corresponding to the blue color typically ranges from 360 to 500 nm.

The color of each color filter may be distinguished by a peak wavelength at which the transmittance of the color filter peaks. The peak wavelength of the transmittance of the color filter for the blue color is typically about 450 nm. The peak wavelength of the transmittance of the color filter for the green color is typically about 540 nm. The peak wavelength of the transmittance of the color filter for the red color is typically about 630 nm.

The color filter of each effective pixel 13 may be formed of a color filter member. The color filter of each pixel 11 may be formed of color filter members having different compositions provided that the color of a region in which the color filter is disposed is substantially the same as that in another region.

In FIG. 13, some of the pixels are denoted by the symbol "A". The pixels denoted by "A" are optical black pixels 15 (referred to below as OB pixels 15) that are shielded from light by a light-shielding film. Each effective pixel 13 has a first conductivity-type semiconductor region that serves as an electric charge generation unit that stores an electric charge that is generated by the photoelectric conversion. Each OB pixel 15 includes a first conductivity-type semiconductor region corresponding to the electric charge generation unit of the effective pixel 13. The first conductivity-type semiconductor region of the OB pixel 15 is shielded from light.

In FIG. 13, some of the pixels are denoted by the symbol "N". The pixels denoted by "N" are reference pixels 17. The reference pixels 17 have no first conductivity-type semiconductor regions, which the effective pixels 13 and the OB pixels 15 have.

Each signal processing circuit 21 overlaps some of the pixels 11 that are arranged in rows and columns in a plan view. Here, each signal processing circuit 21 overlaps the pixels 11 that are arranged in 4 rows and 12 columns. In particular, one of the signal processing circuits 21 overlaps the OB pixels 15. Another signal processing circuit 21 overlaps the effective pixels 13 and the reference pixel 17. Each signal processing circuit 21 includes a multiplex circuit and an AD conversion circuit, which will be described later. Accordingly, it can be said that in each signal processing circuit 21, the multiplex circuit, or the AD conversion circuit, or both overlap the pixels 11.

The AD conversion circuit according to the present embodiment carries out the AD conversion of the signals of the pixels 11 that are arranged in one column, which will be described later. For example, the signal processing circuit 21 (A) converts the signals of the pixels 11 in the first column, that is, the OB pixels 15 and the reference pixels 17 into digital signals and does not carry out the AD conversion of the signals of the effective pixels 13.

The signal processing circuit 21 (B) converts the signals of the pixels 11 in the second column, that is, the effective pixels 13, the OB pixels 15, and the reference pixels 17 into digital signals.

The signal processing circuit 21 (C) converts the signals of the pixels 11 of the third column, that is, the effective pixels 13, the OB pixels 15, and the reference pixels 17 into digital signals.

This arrangement is described by way of example. According to the present embodiment, some of the pixels 11 may be arranged in rows and columns on each signal processing circuit 21.

Equivalent Circuit of Imaging Device

Figure 14:
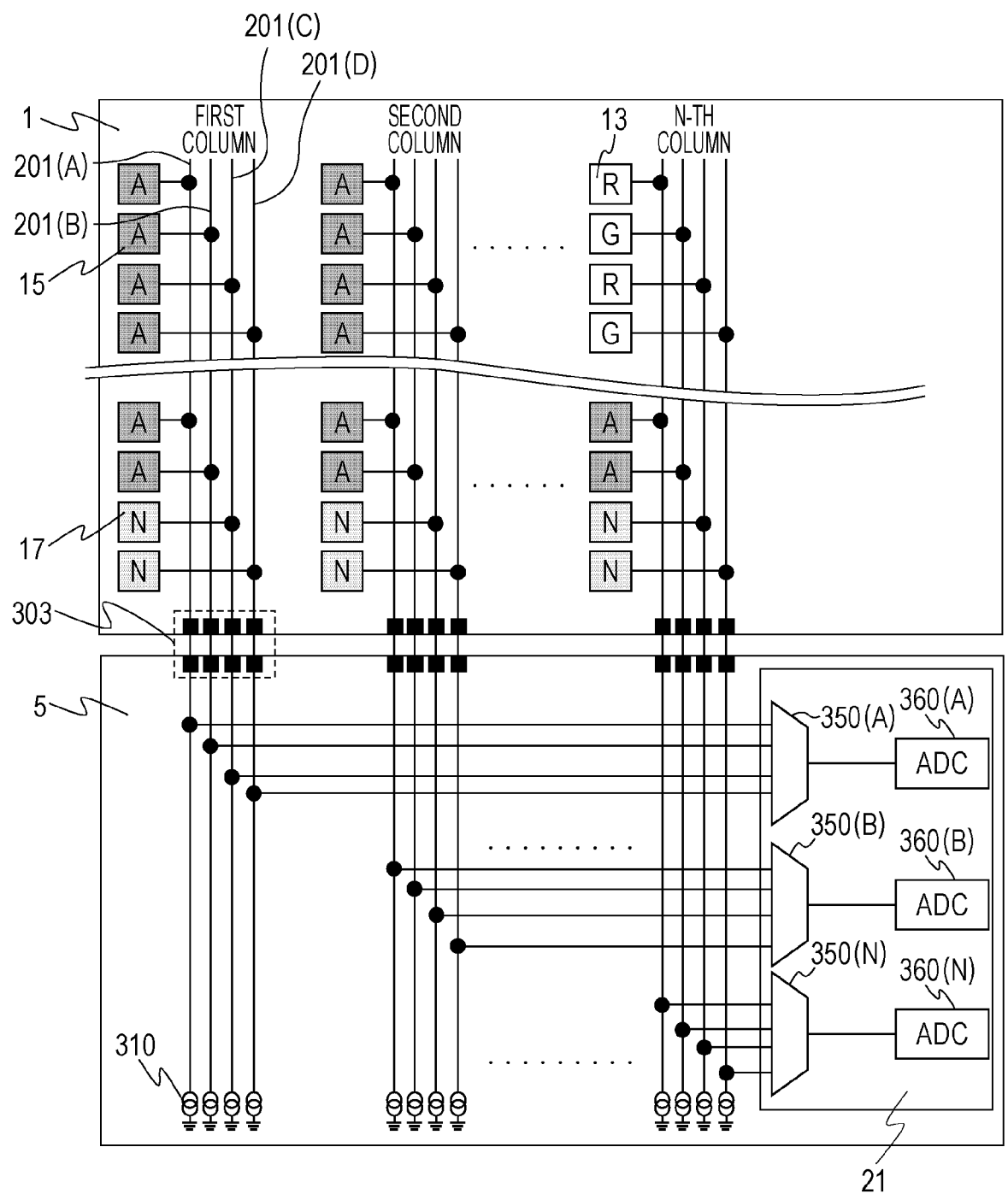
FIG. 14 illustrates the structure of the imaging device.

FIG. 14 illustrates an equivalent circuit of the imaging device. Among the pixels 11 illustrated in FIG. 11, the pixels 11 in the first column, the second column, and the N-th column are illustrated in FIG. 14. The first chip 1 includes four signal lines 201 (A) to 201 (D) for the pixels 11 in one column. In the following description, the signal lines are simply represented by 201 when the signal lines 201 (A) to 201 (D) are not distinguished. The pixels 11 in the first column are connected to the signal line 201 (A). Similarly, the pixels 11 in the second to fourth columns are connected to the signal lines 201 (B) to 201 (D). The signal lines 201 (A) to 201 (D) are arranged in the same manner as with the pixels 11 in the first column.

The signal lines 201 (A) to 201 (D) corresponding to the pixels 11 in one column are connected to a multiplex circuit (referred to below as a MPX circuit) 350 (A) that is included in each signal processing circuit 21 with connections 303 interposed therebetween. The signal processing circuit 21 includes AD conversion circuits (referred to below as ADCs in the description and the drawings) 360 (A) and 360 (B). The MPX circuit 350 (A) is a first selection unit that includes an input portion connected to the signal lines 201 (A) to 201 (D) and an output portion connected to the ADC 360 (A).

The ADCs 360 may be the ADCs 107 described according to the first and fourth embodiments.

The signal lines 201 (A) to 201 (D) corresponding to the pixels 11 in another column are connected to a MPX circuit 350 (B) that is included in each signal processing circuit 21 with the connections 303 interposed therebetween. The MPX circuit 350 (B) is a second selection unit that includes an input portion connected to the signal lines 201 (A) to 201 (D) and an output portion connected to the ADC 360 (B).

As illustrated in FIG. 14, the pixels 11 that are connected to each ADC 360 belong to the same column. According to the present embodiment, the pixels 11 that are connected to the ADC 360 (A) are the OB pixels 15 and the reference pixels 17 that belong to the same column. Similarly, the pixels 11 that are connected to the ADC 360 (B) are the OB pixels 15 and the reference pixels 17 that belong to the same column.

The ADCs 360 (A) and 360 (B) carry out the AD conversion of the signals of the OB pixels 15 that are arranged in the horizontal OB pixel region 812A illustrated in FIG. 12. The ADCs 360 (A) and 360 (B) carry out the AD conversion of the signals of the OB pixels 15 that are arranged in the vertical OB pixel region 812B illustrated in FIG. 12.

The pixels 11 that are connected to the ADC 360 (C) belong to the same column. According to the present embodiment, the pixels 11 that are connected to the ADC 360 (C) are the effective pixels 13, the OB pixels 15, and the reference pixels 17. The ADC 360 (C) does not carry out the AD conversion of the signals of the OB pixels 15 that are arranged in the horizontal OB pixel region 812A illustrated in FIG. 12. The ADC 360 (C) carries out the AD conversion of the signals of the effective pixels 13 that are arranged in the effective pixel region 810, the OB pixels 15 that are arranged in the vertical OB pixel region 812B, and the reference pixels 17 that are arranged in the reference pixel region 815.

As illustrated in FIG. 14, the second chip 5 includes current sources 310. The current sources 310 supply current to the signal lines 201 in the columns via the connections 303.

As illustrated in FIG. 14, the OB pixels 15 and the reference pixels 17 in the horizontal OB pixel region 812A are arranged in the first column of the pixel array. The ADC 360 (A) carries out the AD conversion of the signals that are outputted from the OB pixels 15 in the first column. Referring to the arrangement in FIG. 13, the relationship of the arrangement of the signal processing circuits 21 and the pixels in a plan view is illustrated in FIG. 13. The signal processing circuit 21(A) illustrated in FIG. 13 includes the ADC 360 (A) illustrated in FIG. 14. That is, it can be said that the OB pixels 15 in the horizontal OB pixel region 812A overlap the ADC 360 (A) that carries out the AD conversion of the signals of the OB pixels 15 in a plan view. It can also be said that the OB pixels 15 in the horizontal OB pixel region 812A overlap the ADC 360 (B) that carries out the AD conversion of the signals of the OB pixels 15 in a plan view. According to the present embodiment, the ADCs 360 (A) and 360 (B) overlap the effective pixels 13 in the ninth to twelfth columns in a plan view.

Arrangement of ADCs

Figure 15:
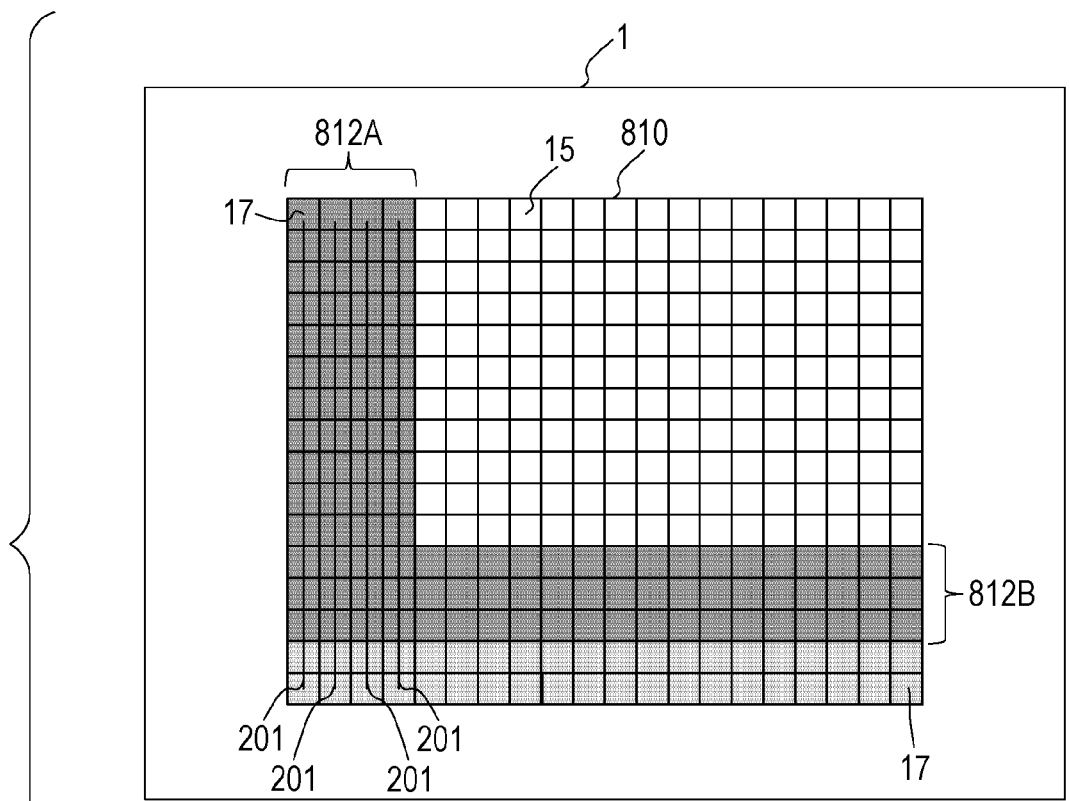
FIG. 15 illustrates a sectional structure of the imaging device.
Figure 15:
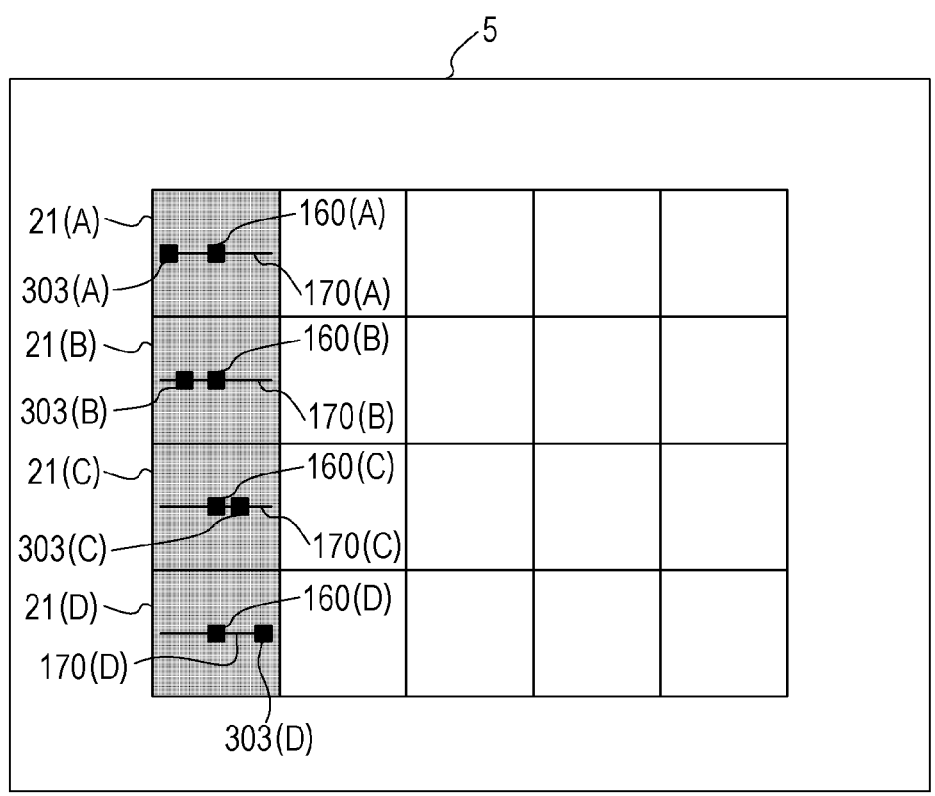

FIG. 15 illustrates part of arrangement of the signal processing circuits 21 that include the ADCs 360 and part of pixel arrangement of the pixel array. In FIG. 15, components like to those in FIG. 12 are designated by like reference numbers.

The signal processing circuit 21 (A) is connected to the pixels 11 in the first column. Specifically, the signal lines 201 that are connected to the pixels 11 in the first column are connected to the connection 303 (A). The connection 303 (A) is connected to an input portion 160 (A) of the signal processing circuit 21 with a connection wiring line 170 (A) interposed therebetween. The pixels 11 in the first column and the signal processing circuit 21(A) are thus connected to each other.

Similarly, the signal processing circuit 21 (B) is connected to the pixels 11 in the second column. The signal processing circuit 21 (C) is connected to the pixels 11 in the third column. The signal processing circuit 21 (D) is connected to the pixels 11 in the fourth column.

The direction from a first pixel group of the pixels 11 in the first column to a second pixel group of the pixels 11 in the second column is referred to as a first direction. That is, the first direction is a direction in which a column number increases. The direction from the signal processing circuit 21 (A) that is connected to the pixels 11 in the first column to the signal processing circuit 21 (B) that is connected to the pixels 11 in the second column is referred to as a second direction that intersects the first direction. The signal processing circuits 21 that carry out the AD conversion of the signals of the OB pixels 15 in the horizontal OB pixel region 812A can be arranged in the same manner as above. Similarly, the signal processing circuits 21 that carry out the AD conversion of the signals of the effective pixels 13 can be arranged in the same manner as above.

According to the present embodiment, the horizontal OB pixel region 812A contains the OB pixels 15 in columns. Assuming that the number of the columns is X, the signal processing circuits 21 that are connected to the OB pixels 15 in the horizontal OB pixel region 812A are arranged in X rows. As illustrated in FIG. 12 and FIG. 15, the horizontal OB pixel region 812A contains the OB pixels 15 in rows. Accordingly, the signal processing circuits 21 that are connected to the OB pixels 15 in the horizontal OB pixel region 812A overlap the horizontal OB pixel region 812A in a plan view. In another perspective, the MPX circuits 350 that are connected to the OB pixels 15 in the horizontal OB pixel region 812A overlap the horizontal OB pixel region 812A in a plan view. In another perspective, the ADCs 360 that carry out the AD conversion of the signals of the OB pixels 15 in the horizontal OB pixel region 812A overlap the horizontal OB pixel region 812A in a plan view.

Structure of Section of Imaging Device Near Connections

Figure 16:
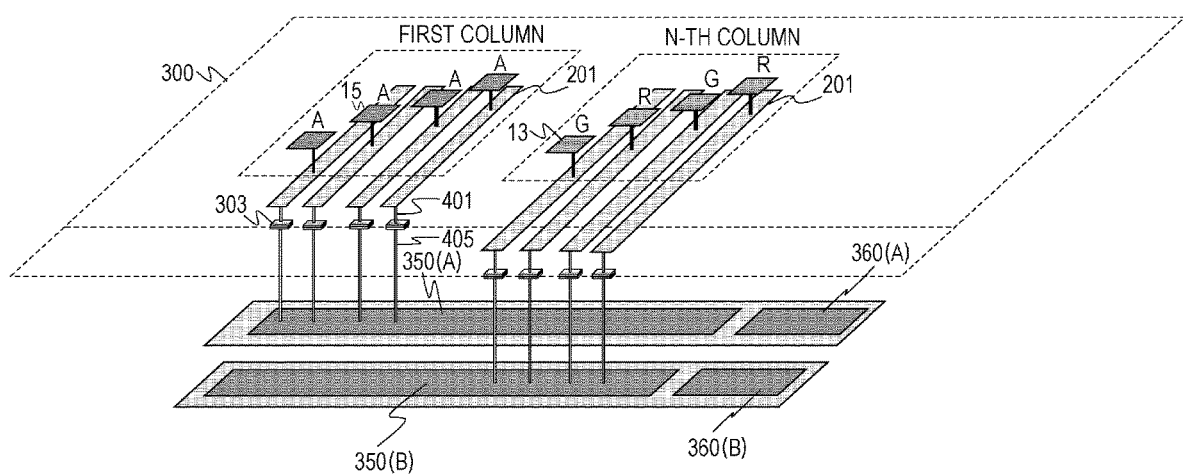
FIG. 16 illustrates connections between the pixels and a signal processing circuit

FIG. 16 illustrates the structure of a section of the imaging device illustrated in FIG. 14. In FIG. 16, the OB pixels 15 in four rows in the first column and the reference pixels 17 in four rows in the fifth column are mainly illustrated. The first chip 1 and the second chip 5 illustrated in FIG. 11 are joined to each other along a bonding surface 300.

The imaging device according to the present embodiment is a back-side illuminated imaging device. Each OB pixel 15 includes a photoelectric converter, not illustrated. The signal lines 201 are located between the photoelectric converter and the bonding surface 300. The signal lines 201 extend in a predetermined direction (direction along the columns in FIG. 16) of the pixels 11. The signal lines 201 are connected to the connections 303 with connection wiring lines 401 interposed therebetween. The MPX circuit 350 (A) is connected to the connections 303 with connection wiring lines 405 interposed therebetween.

In FIG. 16, illustration of the connection wiring lines 170 illustrated in FIG. 15 is omitted. The connection wiring lines 170 may be included in the MPX circuit 350 (A) illustrated in FIG. 16. In another example, the connection wiring lines 170 may be located on a wiring layer between the connection wiring lines 405 and the MPX circuit 350 (A).

The connection wiring lines 401, the connection wiring lines 405, and the connections 303 overlap in a plan view. In other words, the signal processing circuits 21 and the signal lines 201 can be connected to each other in a manner in which the connection wiring lines 401 are formed so as to overlap the connection wiring lines 405 in a plan view. The signal lines 201 and the MPX circuits 350 can be connected to each other by connecting the connection wiring lines 401 to the signal lines 201 that extend in the predetermined direction. In the case where the signal lines 201 extend in the predetermined direction, the connection wiring lines 401 and the signal lines 201 can be readily connected to each other.

Equivalent Circuit of Pixel

Figure 17A:
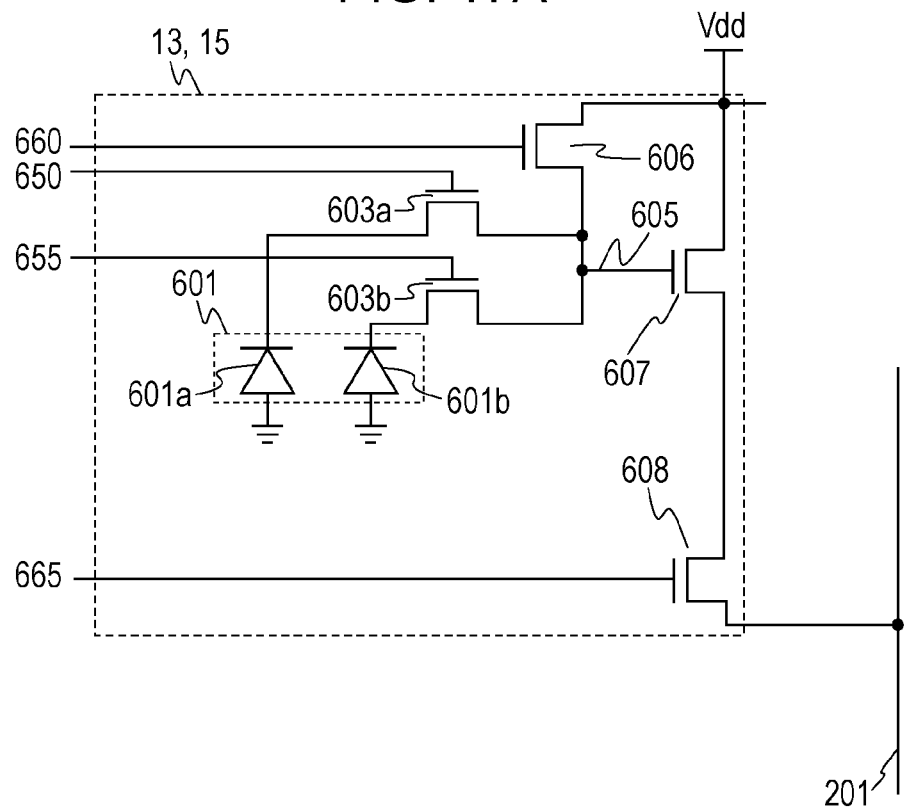
FIGS. 17A and 17B illustrate equivalent circuits of the pixels.

FIG. 17A illustrates an equivalent circuit of one of the effective pixels 13 and the corresponding OB pixel 15 according to the present embodiment. The effective pixel 13 and the OB pixel 15 each include the photodiodes 601a and 601b, which are photoelectric converters. Light that passes through the microlens, not illustrated, and the color filter that is arranged as illustrated in FIG. 13 is incident on the photodiodes 601a and 601b of the effective pixel 13. That is, the wavelength of light incident on the photodiode 601a is substantially the same as the wavelength of light incident on the photodiode 601b. The photodiodes 601a and 601b of the OB pixel 15 are shielded from light.

The photodiode 601a is connected to the floating diffusion portion (referred to as the FD portion) 605 with the transfer transistor 603a interposed therebetween. The gate of the transfer transistor 603a is connected to the vertical scanning circuit, not illustrated FIG. 17A, with the control line 650 interposed therebetween.

The photodiode 601b is connected to the floating diffusion portion (referred to as the FD portion) 605 with the transfer transistor 603b interposed therebetween. The gate of the transfer transistor 603b is connected to the vertical scanning circuit, not illustrated FIG. 17A, with the control line 655 interposed therebetween.

The FD portion 605 is connected to the reset transistor 606 and the gate of the amplifying transistor 607.

The reset transistor 606 and the amplifying transistor 607 are supplied with the power supply voltage Vdd. The gate of the reset transistor 606 is connected to the vertical scanning circuit, not illustrated FIG. 17A, with the control line 660 interposed therebetween.

The amplifying transistor 607 is connected to the selection transistor 608. The gate of the selection transistor 608 is connected to the vertical scanning circuit, not illustrated FIG. 17A, with the control line 665 interposed therebetween.

The selection transistor 608 is connected to the signal line 201.

Figure 17B:
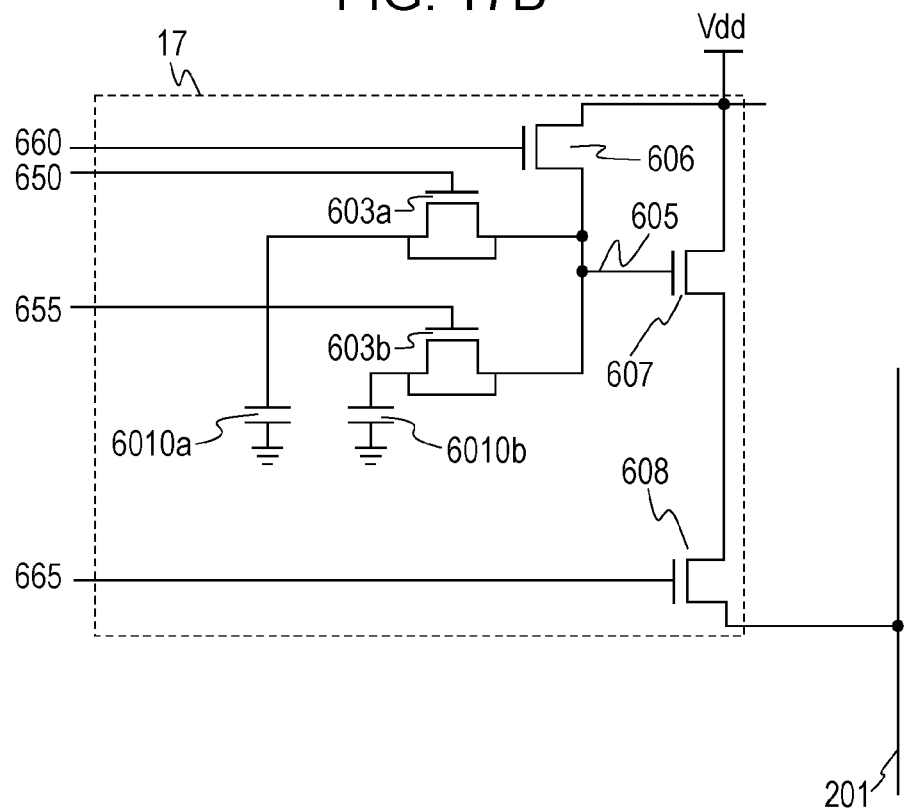

FIG. 17B illustrates an equivalent circuit of one of the reference pixels 17. The equivalent circuit of the reference pixel 17 differs from the equivalent circuit in FIG. 17A in that capacitors 6010a and 6010b are disposed therein instead on the photodiodes 601a and 601b. That is, the reference pixel 17 includes no photoelectric converter.

Operation of Imaging Device

Figure 18A:
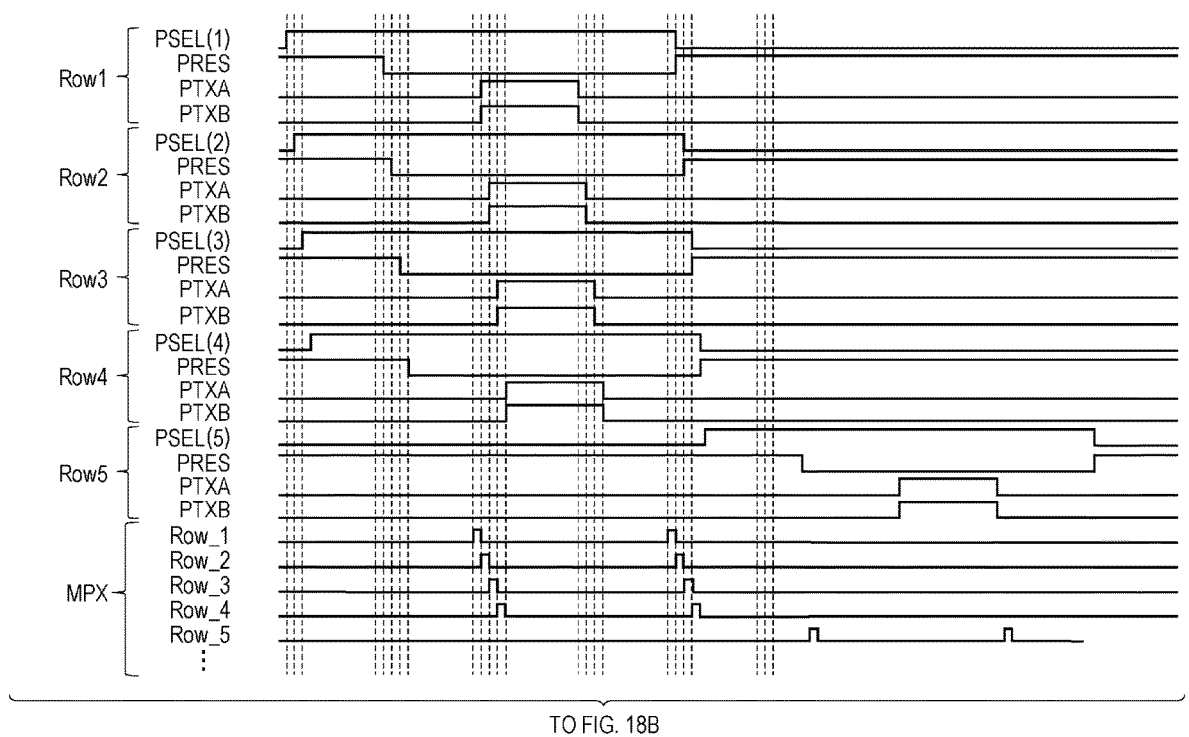
FIGS. 18A and 18B illustrate operation of the imaging device.
Figure 18B:
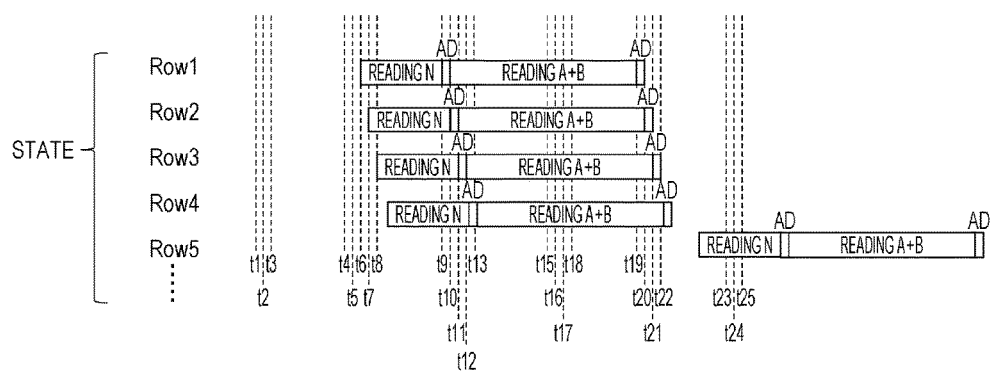

The MPX circuit 350 (A) sequentially outputs the signals of the signal lines 201 (A) to 201 (D) corresponding to the pixels 11 in one column to the ADC 360 (A). FIGS. 18A and 18B illustrate the signals that are outputted from MPX circuit 350 (A) by Row_n, where n is a pixel row corresponding the signals that are outputted from the MPX circuit 350 (A) to the ADC 360 (A). That is, a high-level Row_1 indicates that the MPX circuit 350 (A) outputs, to the ADC 360 (A), the signals that are outputted from the pixels 11 in the first row to the signal line 201 (A).

Operation of Reading Signals N from Pixels 11 in Each Row

At time t1, the vertical scanning circuit sets a signal PSEL (1) that is to be outputted to the pixels 11 in the first row to a high-level signal.

At time t2, the vertical scanning circuit sets a signal PSEL (2) that is to be outputted to the pixels 11 in the second row to a high-level signal.

At time t3, the vertical scanning circuit sets a signal PSEL (3) that is to be outputted to the pixels 11 in the third row to a high-level signal.

After that, similarly, the vertical scanning circuit sets a signal PSEL (4) that is to be outputted to the pixels 11 in the fourth row to a high-level signal.

At time t5, the vertical scanning circuit changes the signal PRES that is to be outputted to the pixels 11 in the first row from a high-level signal to a low-level signal. Consequently, the signals N are outputted to the signal line 201 (A).

At time t6, the vertical scanning circuit changes the signal PRES that is to be outputted to the pixels 11 in the second row from a high-level signal to a low-level signal. Consequently, the signals N are outputted to the signal line 201 (B).

At time t7, the vertical scanning circuit changes the signal PRES that is to be outputted to the pixels 11 in the third row from a high-level signal to a low-level signal. Consequently, the signals N are outputted to the signal line 201 (C).

At time t8, the vertical scanning circuit changes the signal PRES that is to be outputted to the pixels 11 in the fourth row from a high-level signal to a low-level signal. Consequently, the signals N are outputted to the signal line 201 (D).

Operation of AD Conversion of Signals N of Pixels 11 in Each Row

The AD conversion of the signal N will now be described. FIGS. 18A and 18B illustrate an AD conversion block of the AD conversion of the signal N that is carried out multiple times described according to the fourth embodiment.

At time t9, the MPX circuit 350 (A) outputs the signals of the signal line 201 (A), that is, the signals N of the pixels 11 in the first row to the ADC 360 (A). The ADC 360 (A) converts the signals N of the pixels 11 in the first row into digital signals.

At time t10, the MPX circuit 350 (A) outputs the signals of the signal line 201 (B), that is, the signals N of the pixels 11 in the second row to the ADC 360 (A). The ADC 360 (A) converts the signals N of the pixels 11 in the second row into digital signals.

At time t11, the MPX circuit 350 (A) outputs the signals of the signal line 201 (C), that is, the signals N of the pixels 11 in the third row to the ADC 360 (A). The ADC 360 (A) converts the signals N of the pixels 11 in the third row into digital signals.

At time t12, the MPX circuit 350 (A) outputs the signals of the signal line 201 (D), that is, the signals N of the pixels 11 in the fourth row to the ADC 360 (A). The ADC 360 (A) converts the signals N of the pixels 11 in the fourth row into digital signals.

Operation of Reading Signals A+B of Pixels 11 in Each Row

At time t10, the vertical scanning circuit sets signals PTXA and PTXB that are to be outputted to the pixels 11 in the first row to high-level signals. Consequently, the electric charges that the photodiodes 601a and 601b store are transferred to the FD portion 605 via the transfer transistors 603a and 603b. The FD portion 605 adds the electric charges of the photodiodes 601a and 601b. Consequently, the voltage of the FD portion 605 corresponds to an electric charge obtained by adding the electric charges of the photodiodes 601a and 601b. Assuming that the signal that the amplifying transistor 607 outputs on the basis of the voltage of the FD portion 605 derived from only the electric charge of the photodiode 601a is referred to as the signal A. Assuming that the signal that the amplifying transistor 607 outputs on the basis of the voltage of the FD portion 605 derived from only the electric charge of the photodiode 601b is referred to as the signal B. In accordance with the reference, the signal that the amplifying transistor 607 outputs on the basis of the voltage of the FD portion 605 corresponding to the electric charge obtained by adding the electric charges of the photodiodes 601a and 601b can be regarded as the signal A+B that is the sum of the signal A and the signal B. The signals A+B of the pixels 11 in the first row are outputted to the signal line 201 (A).

At time t11, the vertical scanning circuit sets signals PTXA and PTXB that are to be outputted to the pixels 11 in the second row to high-level signals. Consequently, the electric charges that the photodiodes 601a and 601b store are transferred to the FD portion 605 via the transfer transistors 603a and 603b. The signals A+B of the pixels 11 in the second row are then outputted to the signal line 201 (B).

At time t12, the vertical scanning circuit sets signals PTXA and PTXB that are to be outputted to the pixels 11 in the third row to high-level signals. Consequently, the electric charges that the photodiodes 601a and 601b store are transferred to the FD portion 605 via the transfer transistors 603a and 603b. The signals A+B of the pixels 11 in the third row are then outputted to the signal line 201 (C).

At time t13, the vertical scanning circuit sets signals PTXA and PTXB that are to be outputted to the pixels 11 in the fourth row to high-level signals. Consequently, the electric charges that the photodiodes 601a and 601b store are transferred to the FD portion 605 via the transfer transistors 603a and 603b. The signals A+B of the pixels 11 in the fourth row are then outputted to the signal line 201 (D).

Operation of AD Conversion of Signals A+B of Pixels 11 in Each Row

The AD conversion of the signal A+B will now be described. FIGS. 18A and 18B illustrate the AD conversion block of the AD conversion of the signal A+B that is carried out multiple times described according to the first to fourth embodiments.

At time t19, the MPX circuit 350 (A) outputs the signals of the signal line 201 (A), that is, the signals A+B of the pixels 11 in the first row to the ADC 360 (A). The ADC 360 (A) converts the signals A+B of the pixels 11 in the first row into digital signals.

At time t20, the MPX circuit 350 (A) outputs the signals of the signal line 201 (B), that is, the signals A+B of the pixels 11 in the second row to the ADC 360 (A). The ADC 360 (A) converts the signals A+B of the pixels 11 in the second row into digital signals.

At time t21, the MPX circuit 350 (A) outputs the signals of the signal line 201 (C), that is, the signals A+B of the pixels 11 in the third row to the ADC 360 (A). The ADC 360 (A) converts the signals A+B of the pixels 11 in the third row into digital signals.

At time t22, the MPX circuit 350 (A) outputs the signals of the signal line 201 (D), that is, the signals A+B of the pixels 11 in the fourth row to the ADC 360 (A). The ADC 360 (A) converts the signals A+B of the pixels 11 in the fourth row into digital signals.

Subsequently, the vertical scanning circuit sets a signal PSEL (5) for the pixels 11 in the fifth row to a high-level signal. Subsequently, the same operations as above are repeated.

The imaging device according to the present embodiment can thus obtain the digital signals based on the signals N of the pixels and the digital signals based on the signals A+B of the pixels. That is, the imaging device obtains the digital signals based on the signals N of the effective pixels 13 and the digital signals based on the signals A+B thereof. The imaging device also obtains the digital signals based on the signals N of the OB pixels 15 and the digital signals based on the signals A+B thereof. The imaging device also obtains the digital signals based on the signals N of the reference pixels 17 and the digital signals based on the signals A+B thereof. The signals A+B of the OB pixels 15 are based on a dark current component of the FD portion 605 and the electric charge (mainly, the dark current component) of the photodiodes 601a and 601b that are shielded from light. The signals A+B of the reference pixels 17 are based mainly on the dark current component of the FD portion 605.

Subsequently, the digital signals that are generated by the ADCs 360 are outputted to a digital-signal processing circuit via a transfer signal line, not illustrated. The digital-signal processing circuit performs a correction process for decreasing a noise component that is contained in the digital signals based on the signals of the effective pixels 13 by using the digital signals based on the signals of the OB pixels 15 and the digital signals based on the signals of the reference pixels 17.

Effects of Present Embodiment

In the imaging device according to the present embodiment, as described with reference to FIG. 15, the signal processing circuits 21 that are connected to the horizontal OB pixel region 812A overlap the horizontal OB pixel region 812A in a plan view.

It is assumed that the signal processing circuits 21 that are connected to the horizontal OB pixel region 812A do not overlap the horizontal OB pixel region 812A in a plan view but overlap the effective pixel region 810. In this case, the signal lines 201 through which the signals of the effective pixels 13 are transmitted overlap the signal processing circuits 21 into which the signals in the horizontal OB pixel region 812A are inputted. In this case, there is a possibility that crosstalk occurs between the connection wiring lines 170 (see FIG. 15) into which the signals of the OB pixels 15 are inputted and the signal lines 201 into which the signals of the effective pixels 13 are inputted. Consequently, the accuracy of the signals of the OB pixels 15 and the signals of the effective pixels 13 can decrease.

According to the present embodiment, however, the signal processing circuits 21 that are connected to the horizontal OB pixel region 812A overlap the horizontal OB pixel region 812A in a plan view. Accordingly, crosstalk is unlikely to occur between the connection wiring lines 170 into which the signals of the OB pixels 15 are inputted and the signal lines 201 into which the signals of the effective pixels 13 are inputted. Consequently, the accuracy of the signals of the OB pixels 15 and the signals of the effective pixels 13 are unlikely to decrease.

Figure 19A:
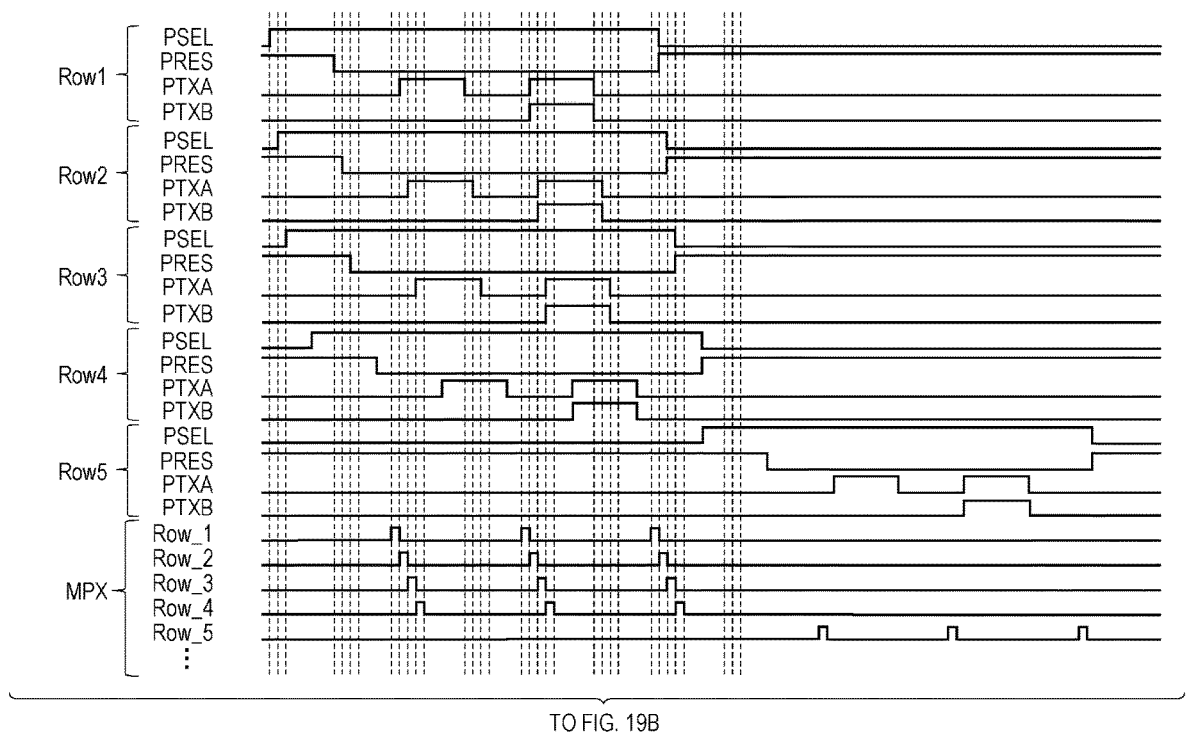
FIGS. 19A and 19B illustrate operation of the imaging device.
Figure 19B:
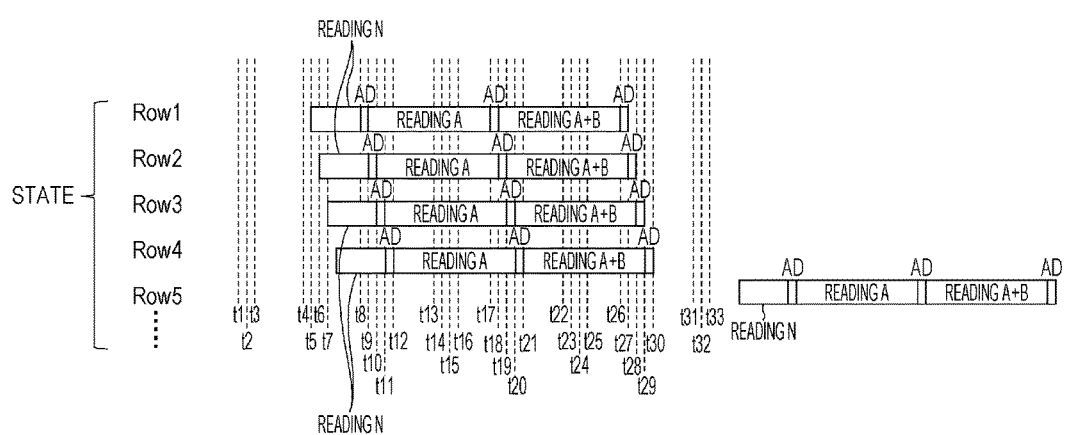

Focus Detection Operation of Imaging Device and Operation Thereof in Imaging Mode FIGS. 19A and 19B illustrate operation of the imaging device to output a focus detection signal and an imaging signal.

Differences from the operation illustrated in FIGS. 18A and 18B will be mainly described below.

Operation of Reading Signals N from Pixels 11 in Each Row

The operation is the same as that illustrated in FIGS. 18A and 18B.

Operation of AD Conversion of Signal N of Pixels 11 in Each Row

The operation is the same as that illustrated in FIGS. 18A and 18B. Operation of Reading Signal A corresponding to Pixels 11 in Each Row At time t9, the vertical scanning circuit sets a signal PTXA that is to be outputted to the pixels 11 in the first row to a high-level signal. Consequently, the electric charge that the photodiode 601a stores is transferred to the FD portion 605 via the transfer transistor 603a. Consequently, the voltage of the FD portion 605 corresponds to the electric charge of the photodiode 601a. The signals A of the pixels 11 in the first row are outputted to the signal line 201 (A) in each column. The signals A are first signals based on the signals of some of the photodiodes. The first signals can be used for focus detection.

At time t10, the vertical scanning circuit sets a signal PTXA that is to be outputted to the pixels 11 in the second row to a high-level signal. Consequently, the signals A of the pixels 11 in the second row are outputted to the signal line 201 (B) in each column.

At time t11, the vertical scanning circuit sets a signal PTXA that is to be outputted to the pixels 11 in the third row to a high-level signal. Consequently, the signals A of the pixels 11 in the third row are outputted to the signal line 201 (C) in each column.

At time t12, the vertical scanning circuit sets a signal PTXA that is to be outputted to the pixels 11 in the fourth row to a high-level signal. Consequently, the signals A of the pixels 11 in the fourth row are outputted to the signal line 201 (D) in each column.

Operation of AD Conversion of Signals A of Pixels 11 in Each Row

The AD conversion of the signal A will now be described. FIGS. 19A and 19B illustrate an AD conversion block of the AD conversion of the signal A that is carried out multiple times described according to the fourth embodiment.

At time t17, the MPX circuit 350 (A) outputs the signals of the signal line 201 (A), that is, the signals A of the pixels 11 in the first row to the ADC 360 (A). The ADC 360 (A) converts the signals A of the pixels 11 in the first row into digital signals.

At time t18, the MPX circuit 350 (A) outputs the signals of the signal line 201 (B), that is, the signals A of the pixels 11 in the second row to the ADC 360 (A). The ADC 360 (A) converts the signals A of the pixels 11 in the second row into digital signals.

At time t19, the MPX circuit 350 (A) outputs the signals of the signal line 201 (C), that is, the signals A of the pixels 11 in the third row to the ADC 360 (A). The ADC 360 (A) converts the signals A of the pixels 11 in the third row into digital signals.

At time t20, the MPX circuit 350 (A) outputs the signals of the signal line 201 (D), that is, the signals A of the pixels 11 in the fourth row to the ADC 360 (A). The ADC 360 (A) converts the signals A of the pixels 11 in the fourth row into digital signals.

Operation of Reading Signals A+B of Pixels 11 in Each Row

At time t18, the vertical scanning circuit sets signals PTXA and PTXB that are to be outputted to the pixels 11 in the first row to high-level signals. Consequently, the electric charges that the photodiodes 601a and 601b store are transferred to the FD portion 605 via the transfer transistors 603a and 603b. The signals A+B of the pixels 11 in the first row are then outputted to the signal line 201 (A).

At time t19, the vertical scanning circuit sets signals PTXA and PTXB that are to be outputted to the pixels 11 in the second row to high-level signals. Consequently, the electric charges that the photodiodes 601a and 601b store are transferred to the FD portion 605 via the transfer transistors 603a and 603b. The signals A+B of the pixels 11 in the second row are then outputted to the signal line 201 (B).

At time t20, the vertical scanning circuit sets signals PTXA and PTXB that are to be outputted to the pixels 11 in the third row to high-level signals. Consequently, the electric charges that the photodiodes 601a and 601b store are transferred to the FD portion 605 via the transfer transistors 603a and 603b. The signals A+B of the pixels 11 in the third row are then outputted to the signal line 201 (C).

At time t21, the vertical scanning circuit sets signals PTXA and PTXB that are to be outputted to the pixels 11 in the fourth row to high-level signals. Consequently, the electric charges that the photodiodes 601a and 601b store are transferred to the FD portion 605 via the transfer transistors 603a and 603b. The signals A+B of the pixels 11 in the fourth row are then outputted to the signal line 201 (D).

Operation of AD Conversion of Signals A+B of Pixels 11 in Each Row

At time t26, the MPX circuit 350 (A) outputs the signals of the signal line 201 (A), that is, the signals A+B of the pixels 11 in the first row to the ADC 360 (A). The ADC 360 (A) converts the signals A+B of the pixels 11 in the first row into digital signals.

At time t27, the MPX circuit 350 (A) outputs the signals of the signal line 201 (B), that is, the signals A+B of the pixels 11 in the second row to the ADC 360 (A). The ADC 360 (A) converts the signals A+B of the pixels 11 in the second row into digital signals.

At time t28, the MPX circuit 350 (A) outputs the signals of the signal line 201 (C), that is, the signals A+B of the pixels 11 in the third row to the ADC 360 (A). The ADC 360 (A) converts the signals A+B of the pixels 11 in the third row into digital signals.

At time t29, the MPX circuit 350 (A) outputs the signals of the signal line 201 (D), that is, the signals A+B of the pixels 11 in the fourth row to the ADC 360 (A). The ADC 360 (A) converts the signals A+B of the pixels 11 in the fourth row into digital signals.

Subsequently, the vertical scanning circuit sets a signal PSEL (5) for the pixels 11 in the fifth row to a high-level signal. Subsequently, the same operations as above are repeated.

The imaging device according to the present embodiment can thus obtain the digital signals based on the signals N of the pixels, the digital signals based on the signals A of the pixels, and the digital signals based on the signals A+B of the pixels.

Additional Effects of Present Embodiment: Speeding Up by Parallel Operations of Imaging Device during Operation in FIGS. 19A and 19B During the operation illustrated in FIGS. 19A and 19B, parallel operations are carried out as follows.

(1) The signals N corresponding to the pixels 11 in the first row are read in parallel with the signals N corresponding to the pixels 11 in the second row being read.
(2) The AD conversions of the signals N corresponding to the pixels 11 in the first row are carried out in parallel with the signals N corresponding to the pixels 11 in the second row being read.
(3) The AD conversions of the signals N corresponding to the pixels 11 in the fourth row are carried out in parallel with the signals A corresponding to the pixels 11 in the first row being read.
(4) The signals A corresponding to the pixels 11 in the first row are read in parallel with the signals A corresponding to the pixels 11 in the second row being read.
(5) The AD conversions of the signals A corresponding to the pixels 11 in the first row are carried out in parallel with the signals A corresponding to the pixels 11 in the second row being read.
(6) The AD conversions of the signals A corresponding to the pixels 11 in the fourth row are carried out in parallel with the signals A+B corresponding to the pixels 11 in the first row being read.
(7) The signals A+B corresponding to the pixels 11 in the first row are read in parallel with the signals A+B corresponding to the pixels 11 in the second row being read.
(8) The AD conversions of the signals A+B corresponding to the pixels 11 in the first row are carried out in parallel with the signal A corresponding to the pixels 11 in the second row being read.

The above parallel operations shorten the period during which, after the ADC 360 (A) carries out AD conversion once, the ADC 360 (A) waits to carry out subsequent AD conversion. This shortens the period required for the AD conversion of the signals that are outputted from all of the pixels 11. Accordingly, the frame rate of the imaging device can be further increased.

The present embodiment is not limited to this example. For example, during one frame period, the effective pixels 13 that include the color filters of the first color may be connected, and the effective pixels 13 that include the color filters for the second color may not be connected. In explanation of this, attention is paid to the effective pixels 13 that include the color filters of R and G in one column. The MPX circuits 350 connect the ADCs 360 to the signal lines 201 (A) and 201 (C) to which the effective pixels 13 that include the color filters of the first color R are connected. During the one frame period, the MPX circuits 350 do not connect the ADCs 360 to the signal lines 201 (B) and 201 (D) to which the effective pixels 13 that include the color filters of the second color G are connected. With this structure, the signals of the effective pixels 13 that are inputted into the ADCs 360 can be signals corresponding to only one color. This enables the AD conversion with the ADCs 360 to be corrected and enables correction after the AD conversion to be simplified.

According to the present embodiment, each signal processing circuit 21 corresponds to the pixels 11 in one column. The present disclosure, however, is not limited thereto. A plurality of the signal processing circuits 21 may correspond to the pixels 11 in one column. For example, the signal processing circuits 21 that are connected to the signal lines 201 (A) and 201 (B) may differ from the signal processing circuits 21 that are connected to the signal lines 201 (C) and 201 (D). Pixel columns may share one of the signal processing circuits 21.

Sixth Embodiment

Figure 20:
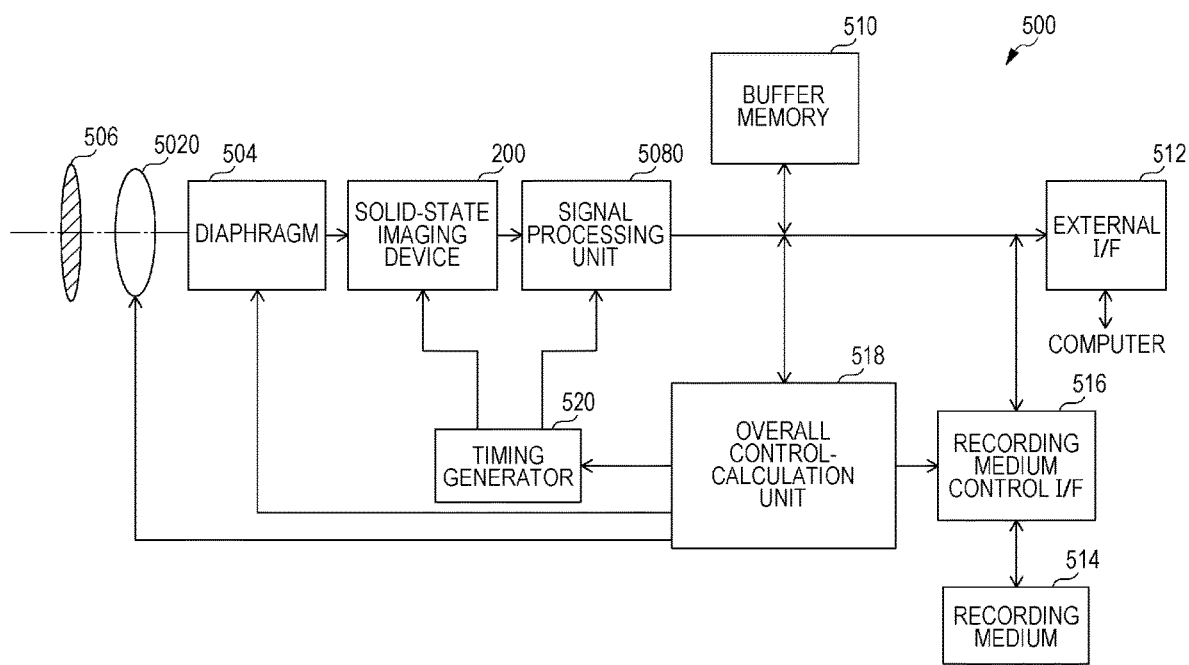
FIG. 20 illustrates the structure of an imaging system.

FIG. 20 is a block diagram illustrating the structure of an imaging system 500 according to a sixth embodiment. The imaging system 500 according to the present embodiment includes an imaging device 200 that has the same structure as any one of the imaging devices described according to the above embodiments. Specific examples of the imaging system 500 include a digital still camera, a digital camcorder, and a surveillance camera. FIG. 20 illustrates an example of the structure of a digital still camera that includes the imaging device 200 that functions as any one of the imaging devices according to the above embodiments.

The imaging system 500 illustrated in FIG. 20 includes the imaging device 200, a lens 5020 that focuses an optical image of an object on the imaging device 200, a diaphragm 504 that varies the amount of light that passes through the lens 5020, and a barrier 506 that protects the lens 5020. The lens 5020 and the diaphragm 504 are optical systems for focusing light on the imaging device 200.

The imaging system 500 also includes a signal processing unit 5080 that processes an output signal that is outputted from the imaging device 200. The signal processing unit 5080 corrects an input signal in various ways and compresses and outputs the signal for signal processing. The signal processing unit 5080 may has a function of performing the AD conversion of the output signal that is outputted from the imaging device 200. In this case, the imaging device 200 does not necessarily include an analog-to-digital converter.

The imaging system 500 includes a buffer memory 510 that temporarily stores image data and an external interface (external I/F) 512 for communication with, for example, an external computer. The imaging system 500 also includes a recording medium 514 such as a semiconductor memory in which image data is recorded and from which the image data is read, and a recording medium control interface (recording medium control I/F) 516 for recoding the image data in the recording medium 514 and reading the image data therefrom. The recording medium 514 may be contained in the imaging system 500 and may be detachable.

The imaging system 500 also includes an overall control-calculation unit 518 that carries out various calculations and controls the entire digital still camera, and a timing generator 520 that outputs various timing signals to the imaging device 200 and the signal processing unit 5080. The timing signals may be inputted from the outside. It is only necessary for the imaging system 500 to include at least the imaging device 200 and the signal processing unit 5080 that processes the output signal that is outputted from the imaging device 200. The overall control-calculation unit 518 and the timing generator 520 may control a part of or the whole of the imaging device 200.

The imaging device 200 outputs an image signal to the signal processing unit 5080. The signal processing unit 5080 processes the image signal that is outputted from the imaging device 200 in a predetermined manner and outputs the image data. The signal processing unit 5080 uses the image signal to generate an image.

The use of the imaging devices according to the above embodiments for the imaging system enables the imaging system to obtain an image having increased quality.

Seventh Embodiment

An imaging system and a moving body according to a seventh embodiment are described with reference to FIGS. 21A and 21B and FIG. 22.

Figure 21A:
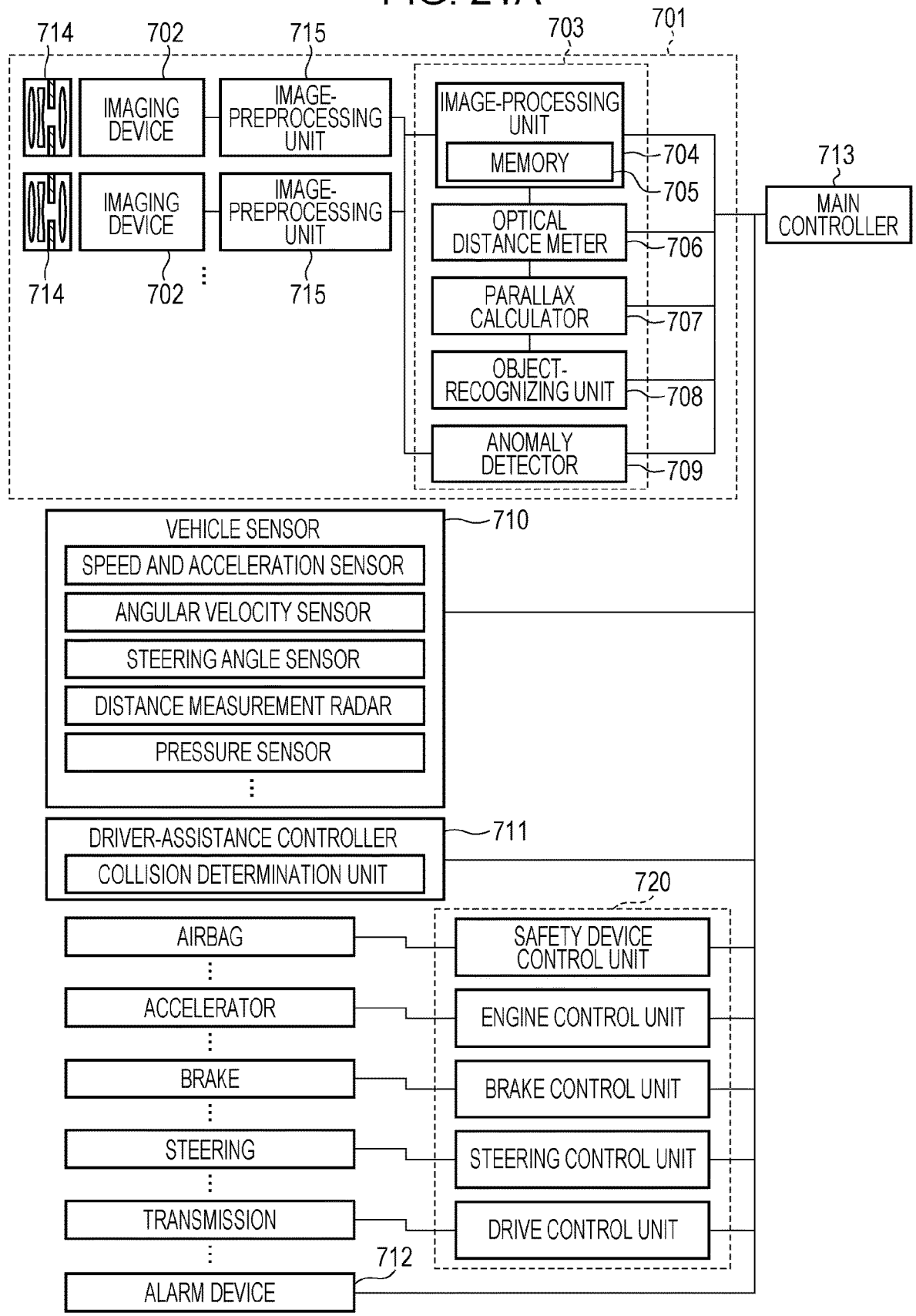
FIGS. 21A and 21B illustrate the structure of a moving body.
Figure 21B:
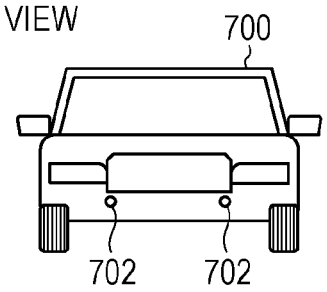
Figure 21B:
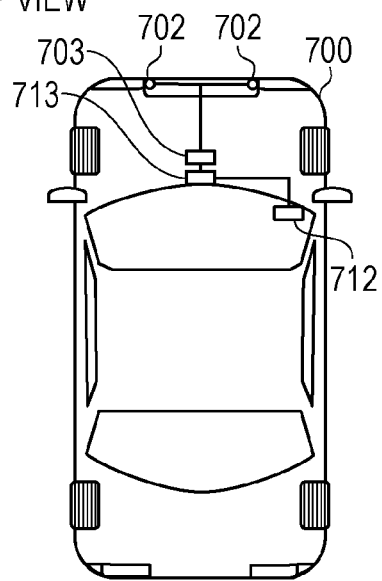
Figure 21B:
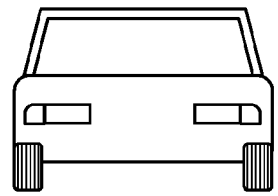
Figure 22:
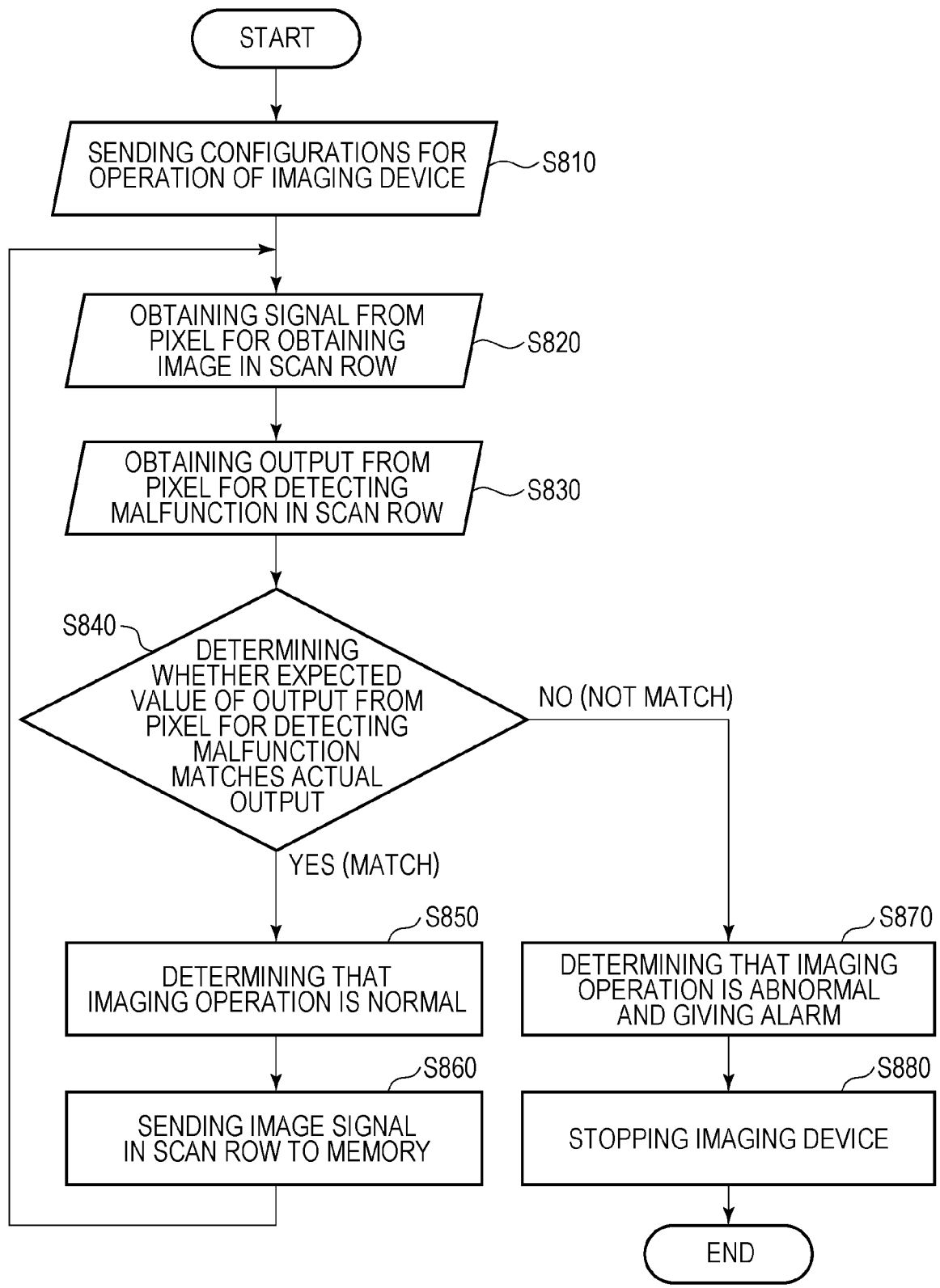
FIG. 22 illustrates processes of the imaging system.

FIGS. 21A and 21B schematically illustrate the imaging system and the moving body according to the present embodiment. FIG. 22 is a flow chart illustrating operation of the imaging system according to the present embodiment.

According to the present embodiment, an example of the imaging system related to a vehicle-mounted camera will be described. FIGS. 21A and 21B illustrate an example of a vehicle system and the imaging system with which the vehicle system is equipped. An imaging system 701 includes imaging devices 702, image-preprocessing units 715, an integrated circuit 703, and optical systems 714. The optical systems 714 focus an optical image of an object on the imaging devices 702. The imaging devices 702 convert the optical image of the object that the optical systems 714 focus into an electric signal. Each imaging device 702 is any one of the imaging devices according to the above embodiments. The image-preprocessing units 715 process the signals that are outputted from the imaging devices 702 in a predetermined manner. The imaging devices 702 may have the function of the image-preprocessing units 715. The imaging system 701 includes at least two trios of the optical systems 714, the imaging devices 702, and the image-preprocessing units 715. The output from the image-preprocessing unit 715 of each trio is inputted into the integrated circuit 703.

The integrated circuit 703 is an integrated circuit for use in the imaging system and includes an image-processing unit 704 that includes a memory 705, an optical distance meter 706, a parallax calculator 707, an object-recognizing unit 708, and an anomaly detector 709. The image-processing unit 704 performs an image process such as a development process and a defect correction process on the output signals of the image-preprocessing units 715. The memory 705 stores the position of a defect of an image pixel and temporarily stores an image that is imaged. The optical distance meter 706 focuses on the object and measures a distance. The parallax calculator 707 calculates a parallax (phase difference of a parallax image) from pieces of image data obtained by the imaging devices 702. The object-recognizing unit 708 recognizes the object such as a car, a road, a sign or a person. When the anomaly detector 709 detects anomaly of the imaging devices 702, the anomaly detector 709 sends information about the anomaly to a main controller 713.

The integrated circuit 703 may be built with an exclusively designed hardware, or may be built with a software module, or a combination thereof. Alternatively, the integrated circuit 703 may be built with, for example, a FPGA (Field Programmable Gate Array), an ASIC (Application Specific Integrated Circuit), or a combination thereof.

The main controller 713 manages and controls operation of the imaging system 701, a vehicle sensor 710, a control unit 720, and other components. In the case where the main controller 713 may not be included, the imaging system 701, the vehicle sensor 710, and the control unit 720 may each include a communication interface via which control signals are sent and received through a communication network (for example, a CAN standard).

The integrated circuit 703 has a function of sending control signals or configurations to the imaging devices 702 by using a controller that the integrated circuit 703 includes or when the integrated circuit 703 receives the control signals from the main controller 713. For example, the integrated circuit 703 sends configurations for pulse-driving voltage switches in the imaging devices 702, configurations for switching the voltage switches every frame, or other configurations.

The imaging system 701 is connected to the vehicle sensor 710 and can detect a state of a vehicle that is running such as a vehicle speed, a yaw rate, a steering angle and a state of an environment of the outside of the vehicle, other vehicles, or an obstacle. The vehicle sensor 710 also functions as a distance-information-obtaining unit that obtains information about distance from the parallax image to the object. The imaging system 701 is connected to a driver-assistance controller 711 that assists a driver in various ways such as automatic steering, automatic cruising, a function of preventing a collision. In particular, a collision determination unit presumes whether a vehicle collides with another vehicle or an obstacle and determines whether the vehicle collides on the basis of the result of detection of the imaging system 701 or the vehicle sensor 710. When the collision determination unit presumes that the vehicle collides, avoidance control is started. In a collision, a safety device is activated.

The imaging system 701 is also connected to an alarm device 712 that gives an alarm to a driver on the basis of the result of determination of the collision determination unit. For example, in the case where the collision determination unit has determined that there is a high possibility of a collision, the main controller 713 controls the vehicle to avoid a collision or to reduce damage, for example, in a manner in which the brake is applied, an accelerator is released, or an engine output is reduced. The alarm device 712 gives an alarm to a user, for example, in a manner in which an alarm is sounded, alarm information is displayed on a screen of, for example, a car navigation system or a meter panel, or a sheet belt or a steering wheel is vibrated.

According to the present embodiment, the imaging system 701 takes a picture of the vicinity of the vehicle, for example, the front or rear thereof. FIG. 21B illustrates an example of the arrangement of the imaging system 701 in the case where the imaging system 701 takes the picture of the front of the vehicle.

The two imaging devices 702 are disposed at the front of a vehicle 700. Specifically, the two imaging devices 702 are disposed symmetrically with each other with respect to a symmetric axis that coincides with a center line that extends in a direction in which the vehicle 700 runs forwards or backwards or a center line of an external shape (for example, the width of the vehicle). This is preferable when information about the distance between the vehicle 700 and the object is obtained or the possibility of a collision is determined. The imaging devices 702 is preferably disposed at a position at which the view of a driver is not obstructed when the driver sights the circumstance of the outside of the vehicle 700 from a driver's seat. The alarm device 712 is preferably disposed at a position at which the driver easily sees the alarm device 712.

Malfunction detecting operation of the imaging devices 702 of the imaging system 701 will now be described with reference to FIG. 22. The malfunction detecting operation of the imaging devices 702 is carried out through steps S810 to S880 illustrated in FIG. 22.

The step S810 is a step at which the configurations of the imaging devices 702 during a startup process are set. That is, the configurations for the operation of the imaging devices 702 are sent from the outside (for example, the main controller 713) of the imaging system 701 or the inside of the imaging system 701, and the imaging operation and the malfunction detecting operation of the imaging devices 702 are started.

Subsequently, at the step S820, pixel signals are obtained from the effective pixels. At the step S830, outputs are obtained from pixels for detecting malfunction. The pixels for detecting malfunction include respective photoelectric converters as in the effective pixels. A predetermined magnitude of voltage is applied to the photoelectric converters. The pixels for detecting malfunction output signals corresponding to the voltage applied to the photoelectric converters. The order of the step S820 and the step S830 may be reversed.

Subsequently, at the step S840, whether expected values of the outputs of the pixels for detecting malfunction match the actual outputs from the pixels for detecting malfunction is determined.

When the expected values of the outputs match the actual outputs at the step S840, the processing step proceeds to the step S850, in which determination that the imaging operation is normal is made, and the processing step proceeds to the step S860. At the step S860, the pixel signals in a scan row are sent to the memory 705 to temporarily stored therein. Subsequently, the processing step returns to the step S820, and the malfunction detecting operation is continued.

When the expected values of the outputs do not match the actual outputs at the step S840, the processing step proceeds to the step S870. At the step S870, determination that the imaging operation is abnormal is made, and an alarm is given to the main controller 713 or the alarm device 712. The alarm device 712 displays detection of anomaly on the screen. Subsequently, at the step S880, the imaging devices 702 are stopped, and the operation of the imaging system 701 is finished.

In an example described according to the present embodiment, the flow chart is looped every row. The flow chart, however, may be looped with respect to plural rows. The malfunction detecting operation may be carried out every frame.

At the step S870, the alarm may be given to the outside of the vehicle via a wireless network.

The control described according to the present embodiment is exerted to avoid a collision with another vehicle. The present embodiment can be used to control automatic driving for following another vehicle or to control automatic driving for preventing the vehicle from moving out of a lane. The imaging system 701 is not limited to the vehicle such as a car and can be used for a moving body (moving device) such as a ship, an aircraft, or an industrial robot. In addition to the moving body, the imaging system 701 may be used for instrument used for recognizing objects in a wide range such as an intelligent transport system (ITS).

Modification

The present disclosure is not limited to the above embodiments. Various modifications can be made.

For example, embodiments of the present disclosure include an embodiment of a combination of a part of one of the above embodiments and another embodiment, and one of the above embodiments a part of which is replaced with a part of another embodiment.

The above embodiments are described by way of example to carry out the present disclosure. The technical scope of the present disclosure is not interpreted in a limited range because of the above embodiments. That is, the present disclosure can be carried out as various embodiments without departing from the technical concept or the principal features.

According to the present disclosure, a successive approximation analog-to-digital converter that can carry out the second AD conversion and successive AD conversions of a signal can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-192054 filed Sep. 29, 2017, which is hereby incorporated by reference herein in its entirety.

What is claimed is:

1. A successive approximation analog-to-digital converter that converts an analog signal into an N-bit (N is an integer of 2 or more) digital signal, the successive approximation analog-to-digital converter comprising:
  a comparator that receives as inputs, the analog signal and a comparison signal;
  a first digital-to-analog converter that converts the comparison signal into a voltage corresponding to each bit of the N bits;
  a second digital-to-analog converter that includes an offsetting unit that applies an offset corresponding to lower n bits of the N bit to the comparison signal; and
  a controller that causes the comparator to perform a plurality of comparisons between the analog signal and the comparison signal that the first digital-to-analog converter converts into the voltage with the offset applied to the comparison signal,
  wherein an amount of the offset applied to the comparison signal by the offsetting unit is a same amount in each of the plurality of comparisons.

2. The successive approximation analog-to-digital converter according to claim 1,
  wherein the first digital-to-analog converter and the second digital-to-analog converter each include a capacitor element and a switch that is connected to the capacitor element, and
  wherein a common voltage is applied to the capacitor element of the first digital-to-analog converter and the capacitor element of the second digital-to-analog converter.

3. The successive approximation analog-to-digital converter according to claim 1,
  wherein a digital signal value corresponding to a noise component contained in the analog signal is obtained, and the offset is a voltage corresponding to a digital signal larger than the digital signal value.

4. The successive approximation analog-to-digital converter according to claim 1, further comprising:
  an amplifier that amplifies an inputted signal with a gain value that is selected from different gain values and outputs the amplified signal as the analog signal to the successive approximation analog-to-digital converter,
  wherein the offset is a voltage corresponding to a first bit number when the amplifier amplifies the inputted signal with a first gain value of the gain values, and
  wherein the offset is a voltage corresponding to a second bit number larger than the first bit number when the amplifier amplifies the inputted signal with a second gain value of the gain values that is larger than the first gain value.

5. An imaging device comprising:
the successive approximation analog-to-digital converter according to claim 1; and
pixels each of which outputs a pixel signal,
wherein the successive approximation analog-to-digital converter uses the pixel signal as the analog signal for AD conversion.

6. The imaging device according to claim 5,
wherein each of the pixels outputs a first signal based on electric charges of some of the photoelectric converters and a second signal based on electric charges of all of the photoelectric converters,
wherein the successive approximation analog-to-digital converter converts the first signal into a digital signal at least two times and converts the second signal into a digital signal at least two times, and
wherein a bit number when the first signal is converted at a second time is lower than a bit number when the second signal is converted at a second time.

7. The imaging device according to claim 6,
wherein each of the pixels outputs a noise signal that is a signal at a noise level,
wherein the successive approximation analog-to-digital converter converts the noise signal into a digital signal at least two times, and
wherein a bit number when the noise signal is converted at a second time is lower than the bit number when the first signal is converted at the second time.

8. The imaging device according to claim 5,
wherein a first chip includes the pixels, a second chip includes the successive approximation analog-to-digital converter, and the first chip and the second chip are stacked.

9. The imaging device according to claim 8,
wherein the first chip further includes a light-shielded pixel that includes a light-shielded photoelectric converter, and
wherein the light-shielded pixel and the successive approximation analog-to-digital converter overlap in a plan view.

10. An imaging system comprising:
the imaging device according to claim 5; and
a signal processing unit that processes a signal that is outputted from the imaging device to generate an image.

11. A moving body comprising:
the imaging device according to claim 5;
a distance-information-obtaining unit that obtains information about a distance from a parallax image based on a signal from the imaging device to an object; and
a control unit that controls the moving body on a basis of the information about the distance.

12. An imaging device comprising:
pixels each of which includes photoelectric converters; and
a successive approximation analog-to-digital converter,
wherein each of the pixels outputs a first signal based on electric charges of some of the photoelectric converters and a second signal based on electric charges of all of the photoelectric converters,
wherein the successive approximation analog-to-digital converter converts the first signal into a digital signal at least two times and converts the second signal into a digital signal at least two times, and
wherein a bit number when the first signal is converted at a second time is lower than a bit number when the second signal is converted at a second time.

13. The imaging device according to claim 12,
wherein each of the pixels outputs a noise signal that is a signal at a noise level,
wherein the successive approximation analog-to-digital converter converts the noise signal into a digital signal at least two times, and
wherein a bit number when the noise signal is converted at a second time is lower than the bit number when the first signal is converted at the second time.

14. The imaging device according to claim 12,
wherein a first chip includes the pixels, a second chip includes the successive approximation analog-to-digital converter, and the first chip and the second chip are stacked.

15. The imaging device according to claim 14,
wherein the first chip further includes a light-shielded pixel that includes a light-shielded photoelectric converter, and
wherein the light-shielded pixel and the successive approximation analog-to-digital converter overlap in a plan view.

16. An imaging system comprising:
the imaging device according to claim 12; and
a signal processing unit that processes a signal that is outputted from the imaging device to generate an image.

17. A moving body comprising:
the imaging device according to claim 12; and
a distance-information-obtaining unit that obtains information about a distance from a parallax image based on a signal from the imaging device to an object; and
a control unit that controls the moving body on a basis of the information about the distance.

* * * * *